(12) United States Patent
Khlat et al.

(10) Patent No.: US 10,680,559 B2
(45) Date of Patent: Jun. 9, 2020

(54) ENVELOPE TRACKING SYSTEM FOR TRANSMITTING A WIDE MODULATION BANDWIDTH SIGNAL(S)

(71) Applicant: Qorvo US, Inc., Greensboro, NC (US)

(72) Inventors: Nadim Khlat, Cugnaux (FR); Andrew F. Folkmann, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/888,300

(22) Filed: Feb. 5, 2018

(65) Prior Publication Data

US 2019/0109613 A1    Apr. 11, 2019

Related U.S. Application Data

(60) Provisional application No. 62/573,911, filed on Oct. 18, 2017, provisional application No. 62/568,961, filed on Oct. 6, 2017.

(51) Int. Cl.
*H04B 1/38*        (2015.01)
*H03F 1/02*        (2006.01)
(Continued)

(52) U.S. Cl.
CPC ......... *H03F 1/0233* (2013.01); *H03F 1/0222* (2013.01); *H03F 1/3241* (2013.01);
(Continued)

(58) Field of Classification Search
CPC ................... H04B 1/0475; H04B 1/40; H04B 2001/0425; H04W 52/0209
(Continued)

(56) References Cited

U.S. PATENT DOCUMENTS 5,838,732 A    11/1998    Carney
6,107,862 A    8/2000    Mukainakano et al.
(Continued)

OTHER PUBLICATIONS

Non-Final Office Action for U.S. Appl. No. 14/836,634, dated May 16, 2016, 9 pages.
(Continued)

*Primary Examiner* — Helene E Tayong
(74) *Attorney, Agent, or Firm* — Withrow & Terranova, P.L.L.C.

(57) ABSTRACT

An envelope tracking (ET) system is provided. The ET amplifies a radio frequency (RF) signal correspond to an amplitude bandwidth exceeding a voltage modulation bandwidth limitation of the ET system. The ET system compresses the amplitude bandwidth to match the voltage modulation bandwidth of the ET system. More specifically, the ET system compresses a predefined voltage waveform, which tracks time-variant amplitudes of a digital form of the RF signal, to generate a modified voltage waveform at a reduced bandwidth. To ensure that signal distortion(s) resulted from the bandwidth compression can be corrected, the ET system nonlinearly modifies predefined amplitude(s) of the predefined voltage waveform to generate modified amplitude(s) of the modified voltage waveform that is never less than the predefined amplitude(s) of the predefined voltage waveform. As such, the ET system can amplify the RF signal with improved linearity and efficiency, without degrading spectral performance of the RF signal.

20 Claims, 13 Drawing Sheets

(51) Int. Cl.
*H03F 3/24* (2006.01)
*H03F 3/19* (2006.01)
*H03F 1/32* (2006.01)
*H04B 1/04* (2006.01)
*H04B 1/40* (2015.01)
*H04W 52/02* (2009.01)
*H04W 28/06* (2009.01)
*H04L 29/06* (2006.01)

(52) U.S. Cl.
CPC .............. *H03F 3/19* (2013.01); *H03F 3/245* (2013.01); *H04B 1/0475* (2013.01); *H04B 1/40* (2013.01); *H04W 52/0209* (2013.01); *H03F 2200/105* (2013.01); *H03F 2200/336* (2013.01); *H03F 2200/451* (2013.01); *H03F 2201/3215* (2013.01); *H04B 2001/0408* (2013.01); *H04B 2001/0425* (2013.01); *H04L 69/04* (2013.01); *H04W 28/06* (2013.01)

(58) Field of Classification Search
USPC ........................................................ 375/219
See application file for complete search history.

(56) References Cited

U.S. PATENT DOCUMENTS

| | | | |
|---|---|---|---|
| 6,141,377 A | 10/2000 | Sharper et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 8,461,928 B2 | 6/2013 | Yahav et al. | |
| 8,493,141 B2 | 7/2013 | Khlat et al. | |
| 8,718,188 B2 * | 5/2014 | Balteanu ............... | H03F 1/0227 375/297 |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,020,451 B2 | 4/2015 | Khlat | |
| 9,041,364 B2 | 5/2015 | Khlat | |
| 9,041,365 B2 | 5/2015 | Kay et al. | |
| 9,065,509 B1 * | 6/2015 | Yan ..................... | H04B 1/0475 |
| 9,069,365 B2 | 6/2015 | Brown et al. | |
| 9,098,099 B2 | 8/2015 | Park et al. | |
| 9,166,830 B2 | 10/2015 | Camuffo et al. | |
| 9,197,182 B2 | 11/2015 | Baxter et al. | |
| 9,225,362 B2 | 12/2015 | Drogi et al. | |
| 9,263,997 B2 | 2/2016 | Vinayak | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,981 B2 | 3/2017 | Khlat | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,923,520 B1 | 3/2018 | Abdelfattah et al. | |
| 10,003,416 B1 * | 6/2018 | Lloyd ................... | H04B 17/15 |
| 10,110,169 B2 | 10/2018 | Khesbak et al. | |
| 10,170,989 B2 | 1/2019 | Balteanu et al. | |
| 2002/0167827 A1 | 11/2002 | Umeda et al. | |
| 2004/0266366 A1 | 12/2004 | Robinson et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0240786 A1 * | 10/2006 | Liu ....................... | H03F 1/3247 455/114.3 |
| 2007/0052474 A1 | 3/2007 | Saito | |
| 2009/0016085 A1 | 1/2009 | Rader et al. | |
| 2009/0045872 A1 | 2/2009 | Kenington | |
| 2010/0308919 A1 | 12/2010 | Adamski et al. | |
| 2011/0074373 A1 | 3/2011 | Lin | |
| 2011/0136452 A1 | 6/2011 | Pratt et al. | |
| 2011/0175681 A1 | 7/2011 | Inamori et al. | |
| 2011/0279179 A1 | 11/2011 | Vice | |
| 2012/0194274 A1 | 8/2012 | Fowers et al. | |
| 2012/0200435 A1 * | 8/2012 | Ngo ..................... | H03M 7/3073 341/61 |
| 2012/0299645 A1 | 11/2012 | Southcombe et al. | |
| 2012/0299647 A1 | 11/2012 | Honjo et al. | |
| 2013/0021827 A1 | 1/2013 | Ye | |
| 2013/0100991 A1 * | 4/2013 | Woo ..................... | H03F 3/24 375/219 |
| 2013/0130724 A1 | 5/2013 | Kumar Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0103995 A1 | 4/2014 | Langer | |
| 2014/0155002 A1 | 6/2014 | Dakshinamurthy et al. | |
| 2014/0184335 A1 | 7/2014 | Nobbe et al. | |
| 2014/0210550 A1 | 7/2014 | Mathe et al. | |
| 2014/0218109 A1 | 8/2014 | Wimpenny | |
| 2014/0235185 A1 * | 8/2014 | Drogi ................... | H04B 1/0475 455/114.2 |
| 2014/0266423 A1 * | 9/2014 | Drogi ..................... | H03F 3/189 330/75 |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2015/0071382 A1 * | 3/2015 | Wu ........................ | H03F 3/24 375/297 |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0065137 A1 * | 3/2016 | Khlat ..................... | H03F 3/19 455/114.3 |
| 2016/0099687 A1 | 4/2016 | Khlat | |
| 2016/0105151 A1 | 4/2016 | Langer | |
| 2016/0118941 A1 | 4/2016 | Wang | |
| 2016/0173031 A1 | 6/2016 | Langer | |
| 2016/0197627 A1 * | 7/2016 | Qin ....................... | H03F 1/0227 375/297 |
| 2016/0294587 A1 | 10/2016 | Jiang et al. | |
| 2017/0141736 A1 | 5/2017 | Pratt et al. | |
| 2017/0302183 A1 | 10/2017 | Young | |
| 2017/0317913 A1 * | 11/2017 | Kim ..................... | H04L 43/0829 |
| 2017/0338773 A1 | 11/2017 | Balteanu et al. | |
| 2018/0048276 A1 | 2/2018 | Khlat et al. | |
| 2018/0076772 A1 | 3/2018 | Khesbak et al. | |
| 2018/0302042 A1 | 10/2018 | Zhang et al. | |
| 2018/0309414 A1 | 10/2018 | Khlat et al. | |
| 2018/0367101 A1 | 12/2018 | Chen et al. | |
| 2019/0097277 A1 | 3/2019 | Fukae | |

OTHER PUBLICATIONS

Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.

(56) References Cited

OTHER PUBLICATIONS

Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Final Office Action for U.S. Appl. No. 15/888,300, dated Feb. 15, 2019, 15 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Notice of Allowance for U.S. Appl. No. 15/984,566, dated May 21, 2019, 6 pages.
Final Office Action for U.S. Appl. No. 15/986,948, dated Aug. 27, 2019, 9 pages.
Final Office Action for U.S. Appl. No. 16/018,426, dated Sep. 4, 2019, 12 pages.
Notice of Allowance for U.S. Appl. No. 16/150,556, dated Jul. 29, 2019, 7 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Non-Final Office Action for U.S. Appl. 16/122,611, dated Mar. 11, 2020, 16 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.

* cited by examiner

ENVELOPE TRACKING SYSTEM FOR TRANSMITTING A WIDE MODULATION BANDWIDTH SIGNAL(S)

RELATED APPLICATIONS

This application claims the benefit of provisional patent application Ser. No. 62/568,961, filed Oct. 6, 2017, and provisional patent application Ser. No. 62/573,911, filed Oct. 18, 2017, the disclosures of which are hereby incorporated herein by reference in their entirety.

FIELD OF THE DISCLOSURE

The technology of the disclosure relates generally to envelope tracking power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltage applied to the PAs to ensure that the PAs are operating at a higher efficiency for a given instantaneous output power requirement of the RF signals.

However, the envelope tracking system can only maintain good linearity and high efficiency up to an inherent bandwidth limit. In the advent of fifth-generation new radio (5G-NR) technology, the RF signals may be modulated with a higher bandwidth than the inherent bandwidth limit of the envelope tracking system, thus reducing linearity and efficiency of the envelope tracking system. As such, it may be desirable to improve linearity and efficiency of the envelope tracking system to support the 5G-NR technology.

SUMMARY

Aspects disclosed in the detailed description include an envelope tracking (ET) system. In examples discussed herein, the ET system is configured to amplify a radio frequency (RF) signal corresponding to an amplitude bandwidth exceeding a voltage modulation bandwidth limitation of the ET system. In this regard, the ET system is configured to compress the amplitude bandwidth to match the voltage modulation bandwidth of the ET system. More specifically, the ET system is configured to compress a predefined voltage waveform, which tracks time-variant amplitudes of a digital form of the RF signal, to generate a modified voltage waveform at a reduced bandwidth (e.g., slew rate). To ensure that signal distortion(s) resulting from the bandwidth compression can be corrected (e.g., via digital predistortion), the ET system nonlinearly modifies predefined amplitude(s) of the predefined voltage waveform to generate modified amplitude(s) of the modified voltage waveform that is never less than the predefined amplitude(s) of the predefined voltage waveform. As such, the ET system can amplify the RF signal with improved linearity and efficiency, without degrading spectral performance of the RF signal.

In one aspect, an ET system is provided. The ET system includes a signal input configured to receive a digital signal corresponding to a signal modulation bandwidth. The ET system also includes a voltage output configured to output a digital voltage signal corresponding to a voltage modulation bandwidth less than the signal modulation bandwidth. The ET system also includes digital voltage processing circuitry. The digital voltage processing circuitry is configured to receive a number of signal amplitudes representing a time-variant amplitude envelope of the digital signal. The digital voltage processing circuitry is also configured to generate a number of predefined voltage amplitudes based on the number of signal amplitudes, respectively. The digital voltage processing circuitry is also configured to nonlinearly modify the number of predefined voltage amplitudes to generate the digital voltage signal comprising a number of modified voltage amplitudes greater than or equal to the number of predefined voltage amplitudes, respectively. The digital voltage processing circuitry is also configured to provide the digital voltage signal to the voltage output.

In another aspect, a transceiver circuit is provided. The transceiver circuit includes a signal input configured to receive a digital signal corresponding to a signal modulation bandwidth. The transceiver circuit also includes a voltage output configured to output a digital voltage signal corresponding to a voltage modulation bandwidth less than the signal modulation bandwidth. The transceiver circuit also includes digital voltage processing circuitry. The digital voltage processing circuitry is configured to receive a number of signal amplitudes representing a time-variant amplitude envelope of the digital signal from the signal input. The digital voltage processing circuitry is also configured to generate a number of predefined voltage amplitudes based on the number of signal amplitudes, respectively. The digital voltage processing circuitry is also configured to nonlinearly modify the number of predefined voltage amplitudes to generate the digital voltage signal comprising a number of modified voltage amplitudes greater than or equal to the number of predefined voltage amplitudes, respectively. The digital voltage processing circuitry is also configured to provide the digital voltage signal to the voltage output. The digital voltage processing circuitry is also configured to generate a number of voltage differential amplitudes indicating amplitude differentials between the number of modified voltage amplitudes and the number of predefined voltage amplitudes, respectively. The transceiver circuit also includes digital signal processing circuitry. The digital signal processing circuitry is configured to receive the number of signal amplitudes from the signal input. The digital signal processing circuitry is also configured to receive the number of voltage differential amplitudes from the digital voltage processing circuitry. The digital signal processing circuitry is also configured to perform digital pre-distortion (DPD) on the number of signal amplitudes and the number of voltage differential amplitudes to generated a pre-distorted digital signal comprising a number of pre-distorted signal amplitudes, respectively. The transceiver circuit also includes a signal output configured to receive and output the pre-distorted digital signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
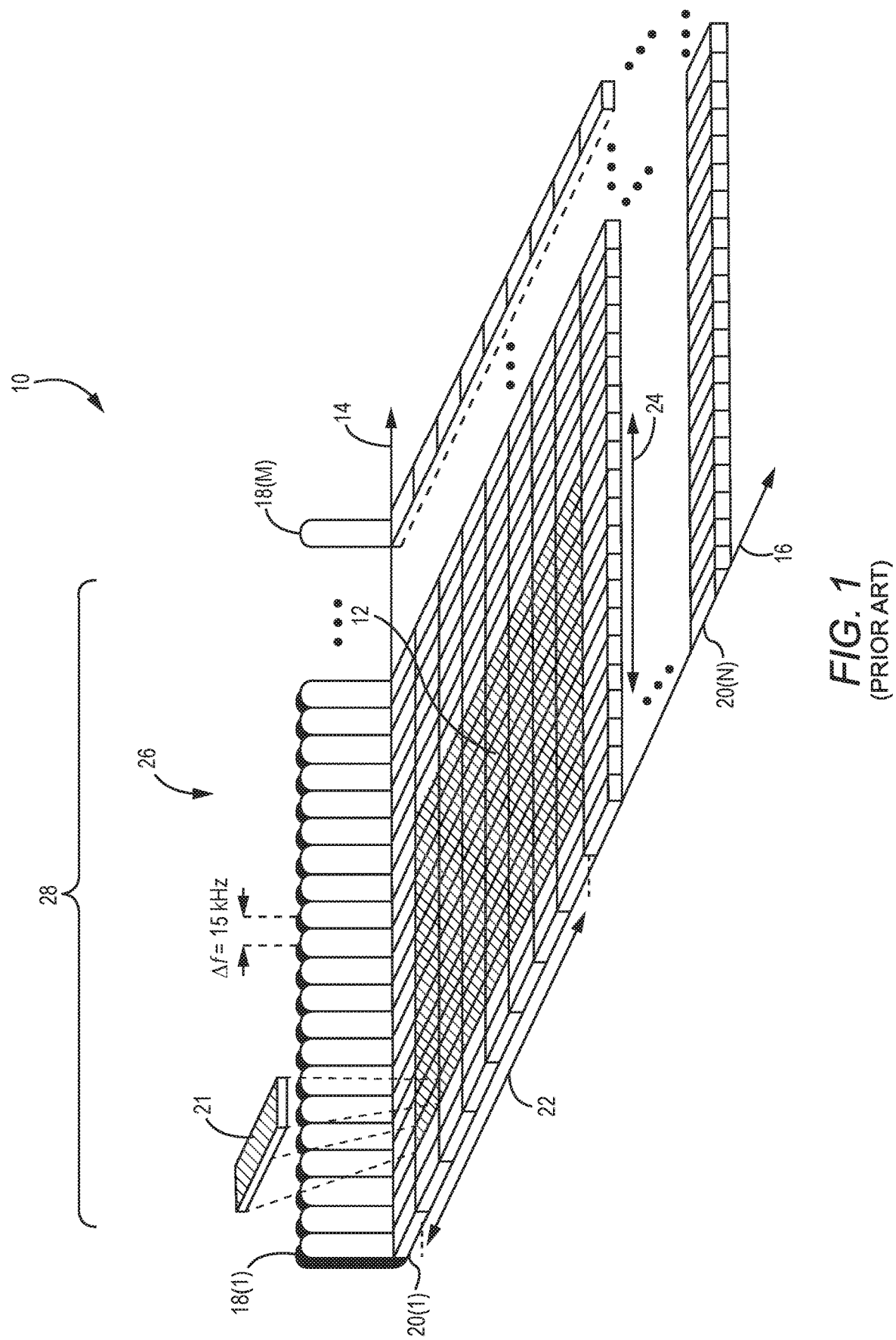
FIG. 1 is a schematic diagram of an exemplary orthogonal frequency division multiplexing (OFDM) time-frequency grid illustrating at least one resource block (RB)

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) system. In examples discussed herein, the ET system is configured to amplify a radio frequency (RF) signal corresponding to an amplitude bandwidth exceeding a voltage modulation bandwidth limitation of the ET system. In this regard, the ET system is configured to compress the amplitude bandwidth to match the voltage modulation bandwidth of the ET system. More specifically, the ET system is configured to compress a predefined voltage waveform, which tracks time-variant amplitudes of a digital form of the RF signal, to generate a modified voltage waveform at a reduced bandwidth (e.g., slew rate). To ensure that signal distortion(s) resulting from the bandwidth compression can be corrected (e.g., via digital predistortion), the ET system nonlinearly modifies predefined amplitude(s) of the predefined voltage waveform to generate modified amplitude(s) of the modified voltage waveform that is never less than the predefined amplitude(s) of the predefined voltage waveform. As such, the ET system can amplify the RF signal with improved linearity and efficiency, without degrading spectral performance of the RF signal.

Before discussing the ET system of the present disclosure, a brief overview of an RB-based resource allocation scheme is first provided with reference to FIG. 1 to help understand the relationship between bandwidth of an RF signal and the number of RBs allocated to the RF signal. A brief discussion of a conventional ET system for amplifying the RF signal is then provided with reference to FIGS. 2A-2C. The discussion of specific exemplary aspects of an ET system according to the present disclosure starts below with reference to FIG. 3.

In this regard, FIG. 1 is a schematic diagram of an exemplary orthogonal frequency division multiplexing (OFDM) time-frequency grid 10 illustrating at least one RB 12. The OFDM time-frequency grid 10 includes a frequency axis 14 and a time axis 16. Along the frequency axis 14, there is a number of subcarriers 18(1)-18(M). The subcarriers 18(1)-18(M) are orthogonally separated from each other by a frequency spacing Δf of 15 KHz. Along the time axis 16, there are a number of OFDM symbols 20(1)-20(N). Each intersection of the subcarriers 18(1)-18M) and the OFDM symbols 20(1)-20(N) defines a resource element (RE) 21.

In one example, the RB 12 includes twelve (12) consecutive subcarriers among the subcarriers 18(1)-18(M), and seven (7) consecutive OFDM symbols among the OFDM symbols 20(1)-20(N). In this regard, the RB 12 includes eighty-four (84) of the REs 21 (12 subcarriers×7 OFDM symbols). The RB 12 has an RB duration 22, which equals a one-half millisecond (0.5 ms), along the time axis 16. Accordingly, the RB 12 has a bandwidth 24, which equals 180 KHz (15 KHz/subcarrier×12 subcarriers), along the frequency axis 14. In OFDM-based communication systems such as long-term evolution (LTE) and fifth-generation new radio (5G-NR), the RB 12 is the minimum unit for allocating resources to users.

In an LTE system, an RF signal 26 can occupy multiple subcarriers among the subcarriers 18(1)-18(M). In this regard, a signal bandwidth 28 of the RF signal 26 is a function of the number of RBs 12 contained in the RF signal 26 along the frequency axis 14. In this regard, if the RF signal 26 contains ten (10) RBs 12, then the signal bandwidth 28 will be 1.8 MHz (180 KHz/RB×10 RBs). If the RF signal 26 contains twenty-five (25) RBs 12, then the signal bandwidth 28 will be 4.5 MHz (180 KHz/RB×25 RBs). If the RF signal 26 contains two hundred (200) RBs 12, then the signal bandwidth 28 will be 36 MHz (180 KHz/RB×200 RBs). In this regard, the more RBs 12 the RF signal 26 contains, the wider the signal bandwidth 28 will be, and the more subcarriers among the subcarriers 18(1)-18(M) are modulated within the RB duration 22. As such, the RF signal 26 can exhibit more and faster amplitude variations within the RB duration 22 when the RF signal 26 is modulated according to a selected modulation and coding scheme (MCS). As a result, when the RF signal 26 is amplified for transmission over a wireless medium, a power amplifier circuit would need to operate fast enough to keep up with the faster amplitude variations of the RF signal 26 across the signal bandwidth 28 within the RB duration 22. Accordingly, a circuit providing ET modulated voltage to the power amplifier circuit needs to provide the ET modulation at a faster frequency (e.g., 250 MHz or above) to keep up with the fast operation of the power amplifier circuit.

Figure 2A:
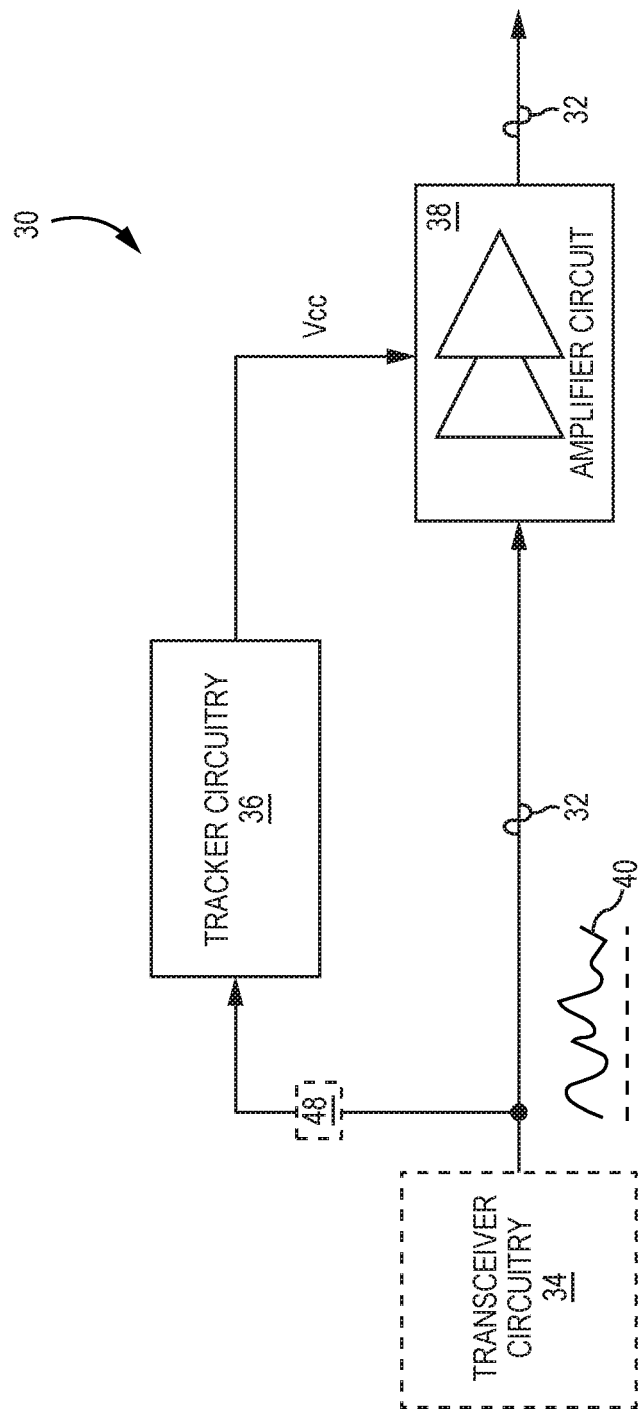
FIG. 2A is a schematic diagram of an exemplary conventional envelope tracking (ET) system that can degrade spectral performance of a radio frequency (RF) signal having a wide modulation bandwidth.

FIG. 2A is a schematic diagram of an exemplary conventional ET system 30 that can degrade spectral performance of an RF signal 32 having a wide modulation bandwidth. In examples discussed hereinafter, such terms as "wide modulation bandwidth" refer to a resource allocation of more than 200 RBs in a corresponding signal, which can be a digital signal or an RF signal.

The conventional ET system 30 includes transceiver circuitry 34, tracker circuitry 36, and an amplifier circuit 38. The transceiver circuitry 34 is configured to modulate the RF signal 32 to the wide modulation bandwidth and generate a time-variant signal envelope 40 representing time-variant amplitude variations of the RF signal 32. In this regard, the time-variant signal envelope 40 can correspond to a voltage bandwidth that is significantly larger than the wide modulation bandwidth of the RF signal 32. The tracker circuitry 36 is configured to generate an ET modulated voltage $V_{CC}$ and provide the ET modulated voltage $V_{CC}$ to the amplifier circuit 38. The amplifier circuit 38 is configured to amplify the RF signal 32 for transmission based on the ET modulated voltage $V_{CC}$.

In order for the amplifier circuit 38 to operate with good linearity and high efficiency, time-variant amplitude of the ET modulated voltage $V_{CC}$ needs to closely track the time-variant signal envelope 40. To do so, the tracker circuitry 36 needs to support a voltage modulation bandwidth that matches the voltage bandwidth of the time-variant signal envelope 40.

Figure 2B:
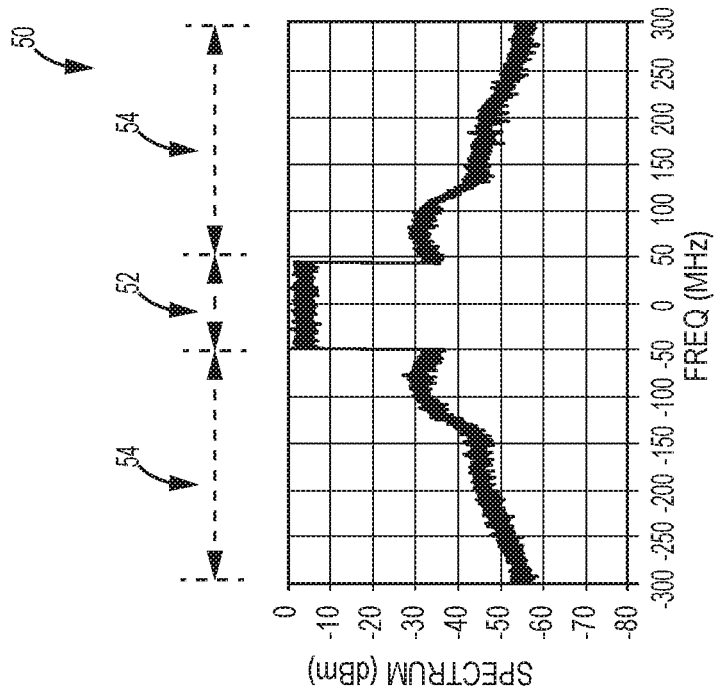
FIG. 2B is a graphic diagram providing an exemplary illustration of a desirable power amplifier output spectrum of the RF signal of FIG. 2A.

When the voltage modulation bandwidth of the tracker circuitry 36 exceeds the voltage bandwidth of the time-variant signal envelope 40, the amplifier circuit 38 can be configured to amplify the RF signal 32 with low spectral regrowth, as shown in FIG. 2B. In this regard, FIG. 2B is a graphic diagram providing an exemplary illustration of a desirable power amplifier output spectrum 42 of the RF signal 32 of FIG. 2A when the voltage modulation bandwidth of the tracker circuitry 36 exceeds the modulation bandwidth of the RF signal 32.

In a non-limiting example, the RF signal 32 is modulated to a modulation bandwidth 44 of 100 MHz. If the voltage modulation bandwidth of the tracker circuitry 36 exceeds the voltage bandwidth of the time-variant signal envelope 40, the ET modulated voltage $V_{CC}$ will be able to track the time-variant signal envelope 40. As a result, the amplifier circuit 38 can be configured to amplify the RF signal 32 with low spectral regrowth 46 (e.g., harmonics, intermodulation distortions, etc.) outside the modulation bandwidth 44. As illustrated in FIG. 2B, the spectral regrowth 46 is approximately −60 dBm.

With reference back to FIG. 2A, it may be impractical to configure the tracker circuitry 36 to provide the voltage modulation bandwidth that exceeds the voltage bandwidth of the time-variant signal envelope 40. In this regard, a signal filter(s) 48, such as a low-pass filter, may be provided in the conventional ET system 30 to reduce the voltage bandwidth of the time-variant signal envelope 40 to match the voltage modulation bandwidth of the tracker circuitry 36. Notably, the signal filter(s) 48 can create signal distortions that may not be recovered through such techniques as digital pre-distortion (DPD). For example, due to inherent insertion loss of the signal filter(s) 48, the time-variant signal envelope 40 may have reduced amplitudes after passing through the signal filter(s) 48, thus making it difficult to correct through DPD. As a result, the RF signal 32, which is amplified by the amplifier circuit 38 based on the clipped time-variant signal envelope 40, may suffer degraded spectral performance, as shown in FIG. 2C.

Figure 2C:
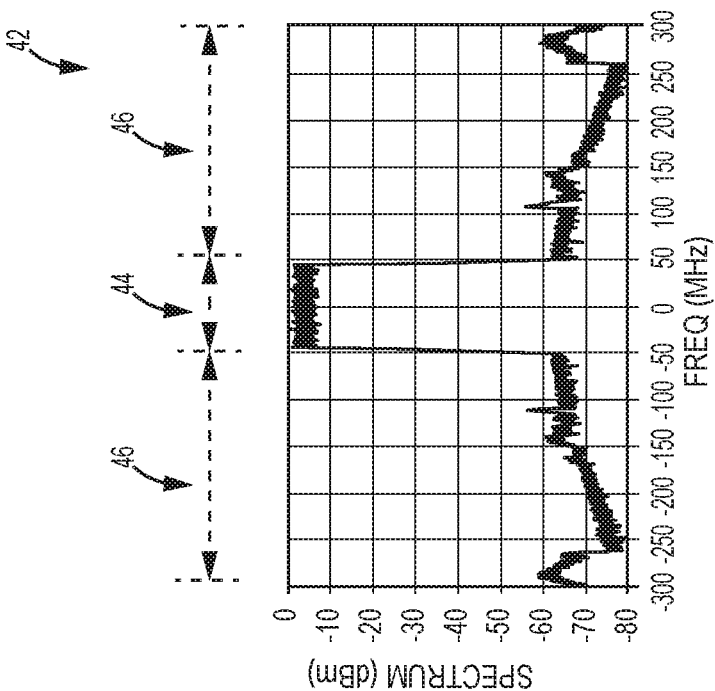
FIG. 2C is a graphic diagram providing an exemplary illustration of a degraded power amplifier output spectrum of the RF signal of FIG. 2A.

FIG. 2C is a graphic diagram providing an exemplary illustration of a degraded power amplifier output spectrum 50 of the RF signal 32 of FIG. 2A when the voltage modulation bandwidth of the tracker circuitry 36 is less than the voltage bandwidth of the time-variant signal envelope 40. In a non-limiting example, the RF signal 32 is modulated to a modulation bandwidth 52 of 100 MHz. As discussed above in FIG. 2A, the signal filter(s) 48 may be used to reduce the voltage bandwidth of the time-variant signal envelope 40 to match the voltage modulation bandwidth of the tracker circuitry 36. Due to the unrecoverable signal distortion created by the signal filter(s) 48, the ET modulated voltage $V_{CC}$ may not be able to track the time-variant signal envelope 40. As a result, the amplifier circuit 38 may cause the RF signal 32 to suffer a higher spectral regrowth 54 (e.g., harmonics, intermodulation distortions, etc.) outside the modulation bandwidth 52. As illustrated in FIG. 2C, the spectral regrowth 54 can be above −30 dBm.

Given the fact that it may be impractical and/or too costly to upgrade the tracker circuitry 36 of FIG. 2A to provide the voltage modulation bandwidth that matches or exceeds the voltage bandwidth of the time-variant signal envelope 40, it may be necessary to compress the voltage bandwidth of the time-variant signal envelope 40 to match the voltage modulation bandwidth of the tracker circuitry 36. Nevertheless, it may be desirable to compress the voltage bandwidth of the time-variant signal envelope 40 without causing excessive spectral regrowth in the RF signal 32.

Figure 3:
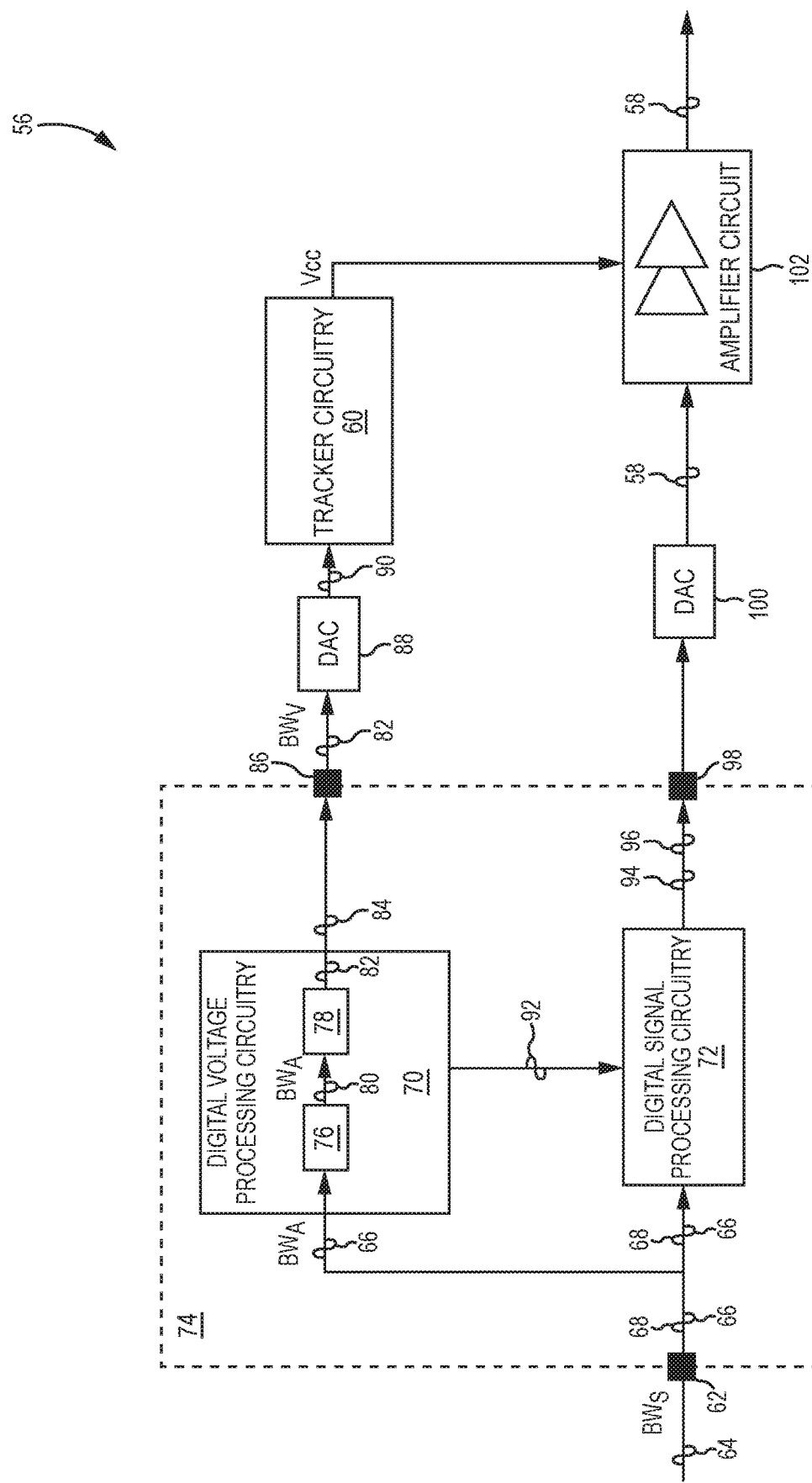
FIG. 3 is a schematic diagram of an exemplary ET system configured to amplify an RF signal, which has a wide modulate bandwidth, based on an ET modulated voltage generated by tracker circuitry having a limited voltage modulation bandwidth without causing spectral degradation in the RF signal.

In this regard, FIG. 3 is a schematic diagram of an exemplary ET system 56 configured to amplify an RF signal 58, which has a wide modulation bandwidth, based on an ET modulated voltage $V_{CC}$ generated by tracker circuitry 60 having a limited voltage modulation bandwidth without causing spectral degradation in the RF signal 58.

The ET system 56 includes a signal input 62 configured to receive a digital signal 64, which is a digital form of the RF signal 58. The digital signal 64 corresponds to a signal modulation bandwidth $BW_S$. The digital signal 64 inherently includes a number of signal amplitudes 66 and a number of signal phases 68. The signal amplitudes 66, which represent a time-variant amplitude envelope of the digital signal 64 and ultimately determine a time-variant amplitude envelope of the RF signal 58, correspond to an amplitude bandwidth $BW_A$ that can be larger than the signal modulation bandwidth $BW_S$.

Given that the voltage modulation bandwidth of the tracker circuitry 60 may be less than the amplitude bandwidth $BW_A$ of the signal amplitudes 66, the ET system 56 is configured to compress the amplitude bandwidth $BW_A$ of the signal amplitudes 66 to a level less than or equal to the voltage modulation bandwidth of the tracker circuitry 60. As opposed to employing the signal filter(s) 48 of FIG. 2A to compress the voltage bandwidth, which can lead to unrecoverable signal distortions, the ET system 56 is configured to compress the amplitude bandwidth $BW_A$ of the signal amplitudes 66 in such a manner that a signal distortion(s) resulted from the bandwidth compression can be corrected through DPD. As discussed in detail below, the ET system 56 is configured to compress a predefined voltage waveform, which tracks time-variant amplitudes of a digital signal, to generate a modified voltage waveform at a reduced bandwidth (e.g., slew rate). To ensure that the signal distortion(s) resulting from the bandwidth compression can be corrected through such digital means as DPD, the ET system 56 is further configured to nonlinearly modify predefined amplitude(s) of the predefined voltage waveform to generate modified amplitude(s) of the modified voltage waveform that is consistently greater than or equal to the predefined amplitude(s) of the predefined voltage waveform. As such, the ET system 56 can amplify the RF signal 58 with improved linearity and efficiency, without degrading spectral performance of the RF signal 58.

The ET system 56 includes digital voltage processing circuitry 70 and digital signal processing circuitry 72. In a non-limiting example, the digital voltage processing circuitry 70 and the digital signal processing circuitry 72 can be provided in a transceiver circuit 74. The digital voltage processing circuitry 70 includes voltage look-up table (LUT) circuitry 76 and nonlinear bandwidth compression circuitry 78. The voltage LUT circuitry 76 is configured to receive the signal amplitudes 66 from the signal input 62 and generate a number of predefined voltage amplitudes 80 that track the signal amplitudes 66. In this regard, the predefined voltage amplitudes 80 can have a respective amplitude bandwidth identical to the amplitude bandwidth $BW_A$. The nonlinear bandwidth compression circuitry 78 is configured to compress the signal amplitude bandwidth $BW_A$ of the signal amplitudes 66 to generate a digital voltage signal 82.

The digital voltage signal 82 corresponds to a voltage modulation bandwidth $BW_V$ that is less than or equal to the amplitude bandwidth $BW_A$ ($BS_V \leq BW_A$) and falls within the voltage modulation bandwidth limit of the tracker circuitry 60. In a non-limiting example, the nonlinear bandwidth compression circuitry 78 can compress the amplitude bandwidth $BW_A$ into the voltage modulation bandwidth $BW_V$ by generating the digital voltage signal 82 at a slower slew rate compared to the digital signal 64. To ensure that signal distortion(s) resulting from the bandwidth reduction can be digitally corrected through DPD, the nonlinear bandwidth compression circuitry 78 is configured to nonlinearly modify the predefined voltage amplitudes 80 to ensure that modified voltage amplitudes 84 are greater than or equal to the predefined voltage amplitudes 80, respectively, at all times. However, because the nonlinear bandwidth compression circuitry 78 modifies the predefined voltage amplitudes 80 nonlinearly, the modified voltage amplitudes 84 may not be proportionally related to the predefined voltage amplitudes 80 according to a constant ratio. More detailed discussion of the nonlinear bandwidth compression performed by the nonlinear bandwidth compression circuitry 78 is provided later in FIGS. 7-10.

The nonlinear bandwidth compression circuitry 78 is configured to provide the digital voltage signal 82 to a voltage output 86, which is coupled to a voltage digital-to-analog converter (DAC) 88. The voltage DAC 88 is configured to convert the digital voltage signal 82 into a target voltage signal 90 having a time-variant voltage envelope that tracks the modified voltage amplitudes 84. In a non-limiting example, the time-variant voltage envelope defines an ET target envelope for the tracker circuitry 60. Accordingly, the tracker circuitry 60 is configured to generate an ET modulated voltage $V_{CC}$ tracking the time-variant voltage envelope of the target voltage signal 90.

The digital voltage processing circuitry 70 is configured to generate a number of voltage differential amplitudes 92 indicating amplitude differentials between the predefined voltage amplitudes 80 and the modified voltage amplitudes 84, respectively. Given that the modified voltage amplitudes 84 are consistently greater than or equal to the predefined voltage amplitudes 80, respectively, the voltage differential amplitudes 92 are always greater than or equal to zero.

The digital signal processing circuitry 72 receives the signal amplitudes 66 from the signal input 62. The digital signal processing circuitry 72 also receives the voltage differential amplitudes 92 from the digital voltage processing circuitry 70. The digital signal processing circuitry 72 is configured to perform DPD on the digital signal 64 based on the signal amplitudes 66 and the voltage differential amplitudes 92 to generate a pre-distorted digital signal 94 that includes a number of pre-distorted signal amplitudes 96, respectively. As such, the pre-distorted digital signal 94 can help correct nonlinear distortion introduced by the nonlinear bandwidth compression circuitry 78, thus helping to restore linearity in the RF signal 58.

The digital signal processing circuitry 72 provides the pre-distorted digital signal 94 to a signal output 98. The signal output 98 is coupled to a signal DAC 100 configured to convert the pre-distorted digital signal 94 into the RF signal 58. The ET system 56 also includes at least one amplifier circuit 102. The amplifier circuit 102 receives the RF signal 58 from the signal DAC 100 and amplifies the RF signal 58 based on the ET modulated voltage $V_{CC}$ received from the tracker circuitry 60.

In summary, the nonlinear bandwidth compression circuitry 78 compresses the amplitude bandwidth $BW_A$ to the voltage modulation bandwidth $BW_V$ that is within the bandwidth capability of the tracker circuitry 60. The nonlinear bandwidth compression circuitry 78 also makes it possible to digitally correct the nonlinear distortion resulting from the bandwidth compression by ensuring the modified voltage amplitudes 84 are greater than or equal to the predefined voltage amplitudes 80, respectively, at all times. Accordingly, the digital signal processing circuitry 72 can pre-distort the digital signal 64 to cause the nonlinear distortion being corrected in the RF signal 58. As a result, as shown next in FIG. 4, it is possible to reduce spectral regrowth in the RF signal 58.

Figure 4:
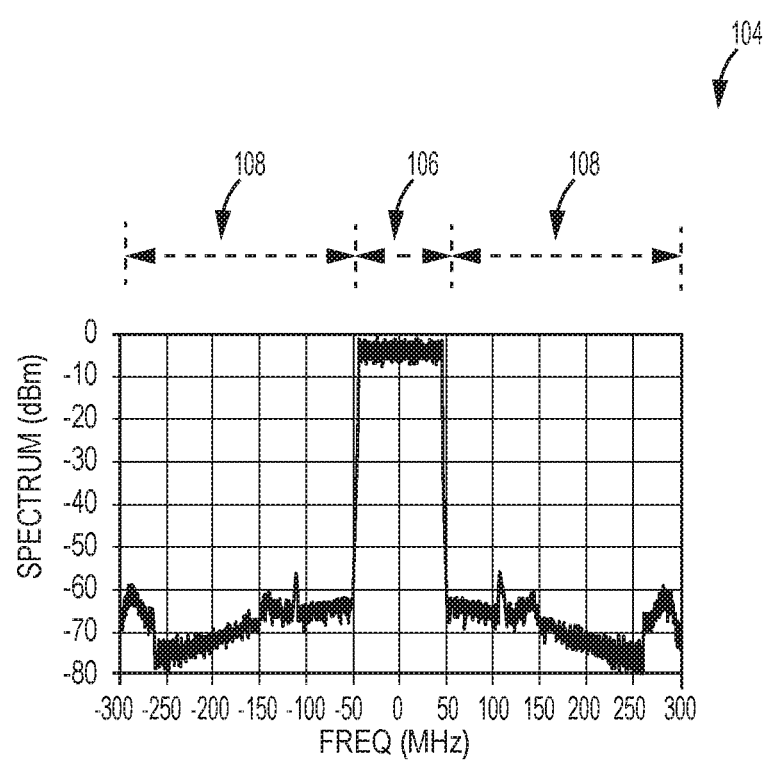
FIG. 4 is a graphic diagram providing an exemplary illustration of an improved power amplifier output spectrum associated with the ET system of FIG. 3.

FIG. 4 is a graphic diagram providing an exemplary illustration of an improved power amplifier output spectrum 104 associated with the ET system 56 of FIG. 3. In a non-limiting example, the RF signal 58 is modulated to a modulation bandwidth 106 of 100 MHz. As a result of the bandwidth compression and digital pre-distortion performed by the digital voltage processing circuitry 70 and the digital signal processing circuitry 72, the RF signal 58 can be amplified with improved spectral regrowth 108 outside the modulation bandwidth 106. As illustrated in FIG. 4, the spectral regrowth 108 is approximately −60 dBm, which is comparable to the low spectral regrowth 46 in the desirable power amplifier output spectrum 42 of FIG. 2B.

Figure 5:
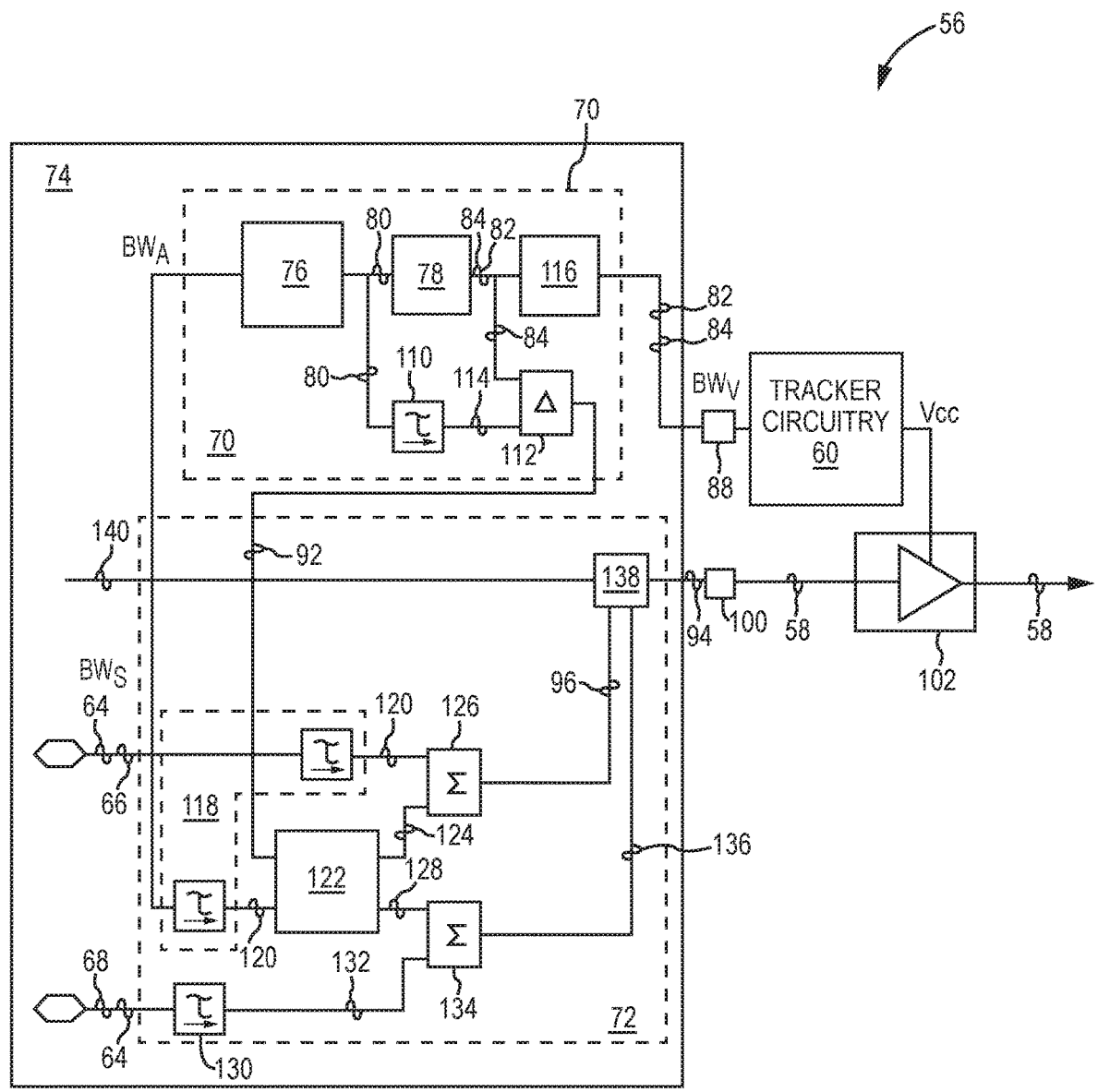
FIG. 5 is a schematic diagram providing an exemplary more detailed illustration of the ET system of FIG. 3.

FIG. 5 is a schematic diagram providing an exemplary more detailed illustration of the ET system 56 of FIG. 3. Common elements between FIGS. 3 and 5 are shown therein with common element numbers and will not be re-described herein.

The digital voltage processing circuitry 70 further includes voltage signal delay circuitry 110 and voltage combiner circuitry 112. The voltage signal delay circuitry 110 is coupled to the voltage LUT circuitry 76 and configured to delay the predefined voltage amplitudes 80 by a defined delay T to generate a number of delayed predefined voltage amplitudes 114. In a non-limiting example, the defined delay T equals an inherent processing delay of the nonlinear bandwidth compression circuitry 78. The voltage combiner circuitry 112 is coupled to the nonlinear bandwidth compression circuitry 78 and the voltage signal delay circuitry 110. The voltage combiner circuitry 112 is configured to combine the modified voltage amplitudes 84 and the delayed predefined voltage amplitudes to generate the voltage differential amplitudes 92, respectively.

The digital voltage processing circuitry 70 may include memory DPD (mDPD) circuitry 116 coupled to the nonlinear bandwidth compression circuitry 78. In a non-limiting example, the mDPD circuitry 116 is configured to pre-distort the digital voltage signal 82 to compensate for distortions that may be generated by the tracker circuitry 60 due to such factors as load impedance mismatch.

The digital signal processing circuitry 72 includes amplitude delay circuitry 118 configured to delay the signal amplitudes 66 by the defined delay T to generate a number of delayed signal amplitudes 120. The digital signal processing circuitry 72 also includes DPD circuitry 122 coupled to the amplitude delay circuitry 118 and the digital voltage processing circuitry 70. The DPD circuitry 122 is configured to digitally pre-distort the digital signal 64 based on the voltage differential amplitudes 92 and the delayed signal amplitudes 120 to generate a number of amplitude correction terms 124. An amplitude combiner 126 combines the amplitude correction terms 124 with the delayed signal amplitudes 120 to generate the pre-distorted signal amplitudes 96.

The DPD circuitry 122 may concurrently generate a number of phase correction terms 128. The digital signal processing circuitry 72 may also include phase delay circuitry 130 configured to delay the signal phases 68 by the defined delay T to generate a number of delayed signal phases 132. A phase combiner 134 combines the delayed signal phases 132 with the phase correction terms 128 to generate a number of pre-distorted signal phases 136. A polar modulator 138, in turn, modulates the pre-distorted signal amplitudes 96 and the pre-distorted signal phases 136 based on an RF carrier signal 140 to generate the pre-distorted digital signal 94 that includes the pre-distorted signal amplitudes 96 and the pre-distorted signal phases 136.

Figure 6:
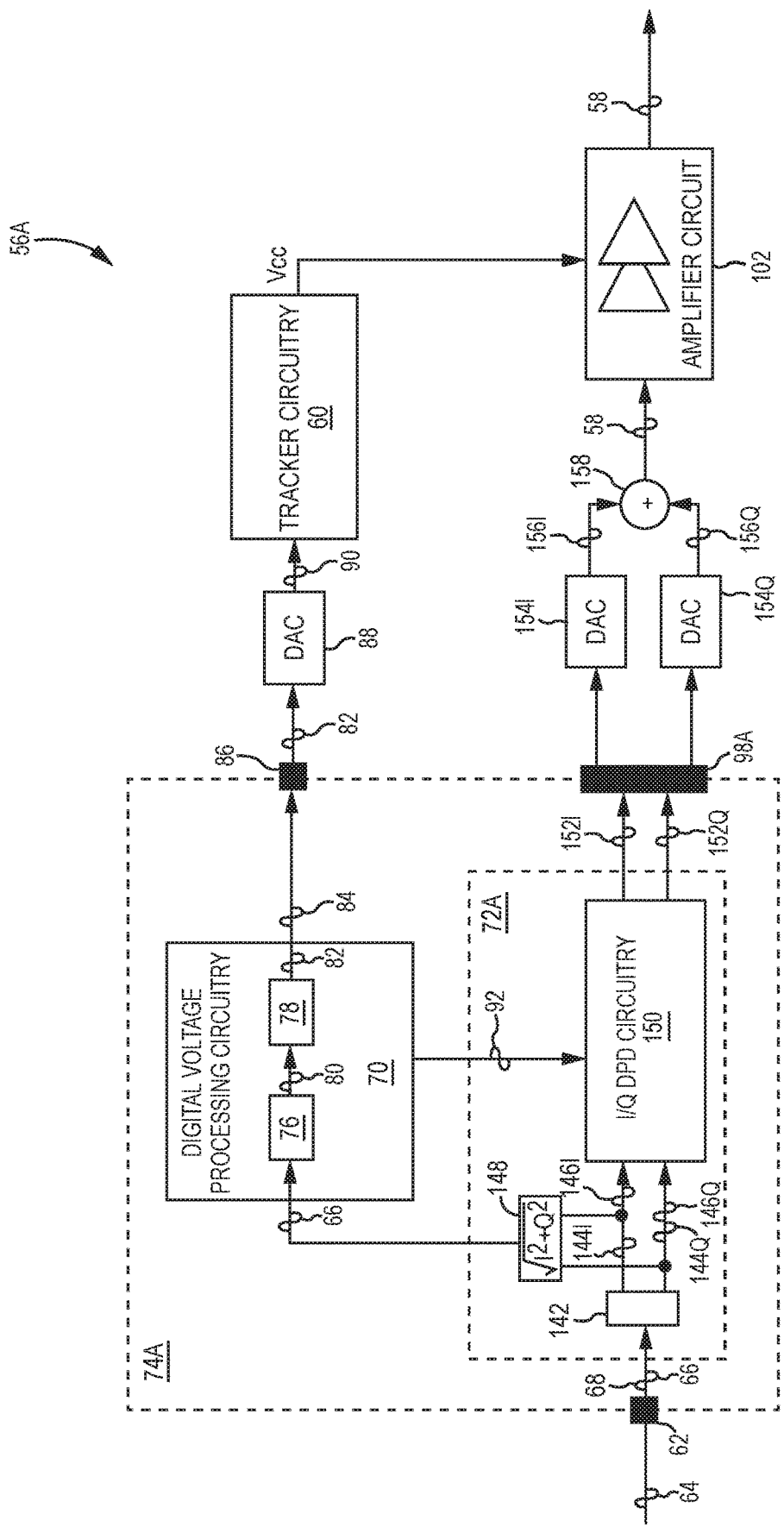
FIG. 6 is a schematic diagram of an exemplary ET system configured to perform digital pre-distortion (DPD) on a digital signal based on in-phase/quadrature (I/Q) modulation.

Alternatively to performing DPD on the digital signal 64 based on polar modulation, it may also be possible to perform DPD on the digital signal 64 based on in-phase/quadrature (I/Q) modulation. In this regard, FIG. 6 is a schematic diagram of an exemplary ET system 56A configured to perform DPD on the digital signal 64 of FIG. 3 based on I/Q modulation. Common elements between FIGS. 3 and 6 are shown therein with common element numbers and will not be re-described herein.

The ET system 56A includes digital signal processing circuitry 72A, which may be provided in a transceiver circuit 74A with the digital voltage processing circuitry 70 of FIG. 3. The digital signal processing circuitry 72A includes digital splitter circuitry 142 configured to receive and split the digital signal 64 into a digital in-phase signal 144I having a number of in-phase signal amplitudes 146I and a digital quadrature signal 144Q having a number of quadrature signal amplitudes 146Q. The digital signal processing circuitry 72A includes amplitude summing circuitry 148 configured to generate the signal amplitudes 66 based on the in-phase signal amplitudes 146I and the quadrature signal amplitudes 146Q and provide the signal amplitudes 66 to the digital voltage processing circuitry 70.

The digital signal processing circuitry 72A includes in-phase/quadrature (I/Q) DPD circuitry 150 configured to digitally pre-distort the digital in-phase signal 144I and the digital quadrature signal 144Q to generate a pre-distorted digital in-phase signal 152I and a pre-distorted digital quadrature signal 152Q, respectively. The digital signal processing circuitry 72A includes a signal output 98A coupled to an in-phase DAC 154I and a quadrature DAC 154Q. The in-phase DAC 154I and the quadrature DAC 154Q are configured to convert the pre-distorted digital in-phase signal 152I and the pre-distorted digital quadrature signal 152Q into an analog in-phase signal 156I and an analog quadrature signal 156Q, respectively. An I/Q combiner 158 combines the analog in-phase signal 156I and the analog quadrature signal 156Q into the RF signal 58.

Figure 7:
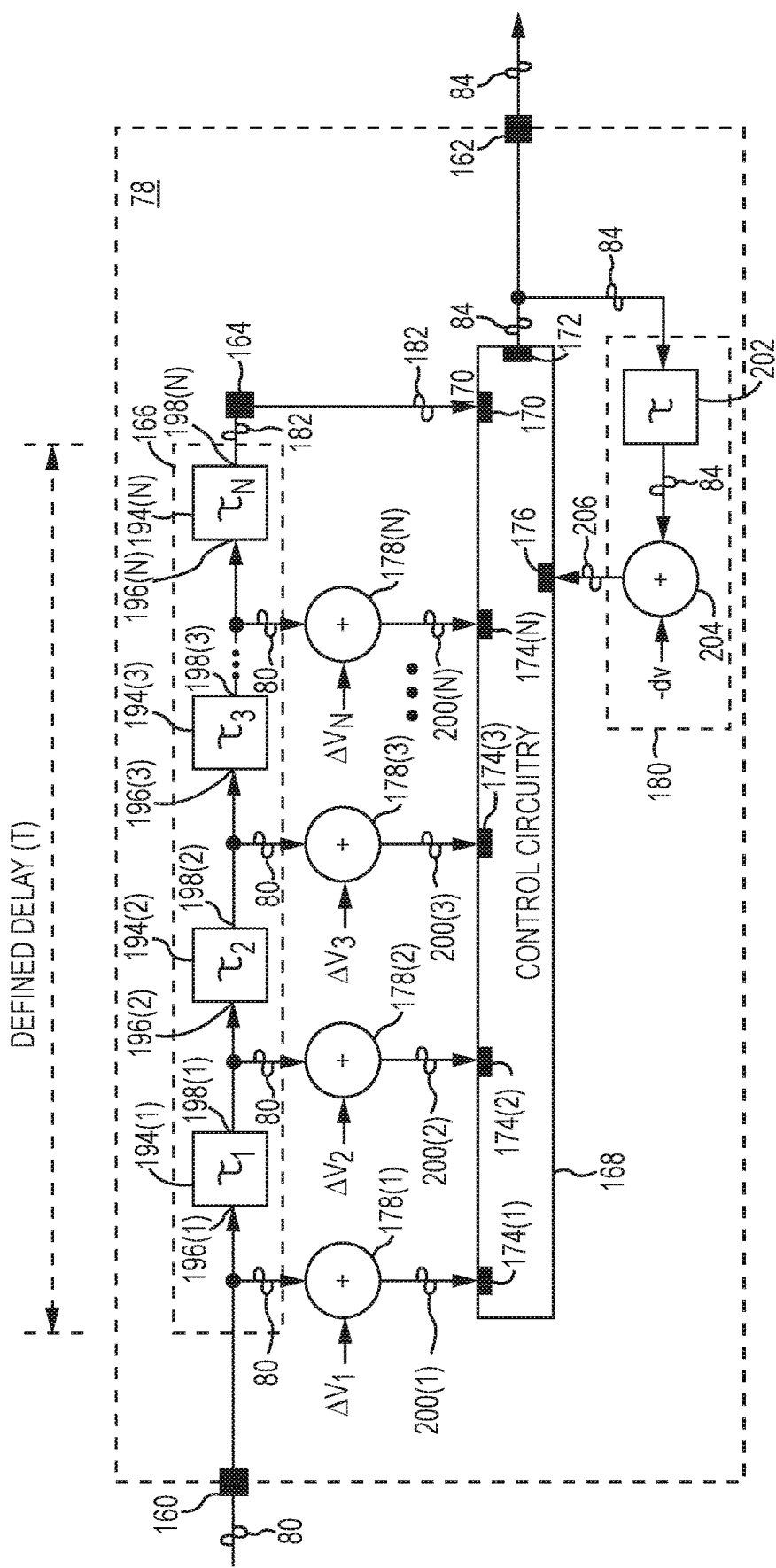
FIG. 7 is a schematic diagram providing an exemplary illustration of nonlinear bandwidth compression circuitry provided in the ET system of FIG. 3 according to one embodiment of the present disclosure.

As previously discussed in FIG. 3, to ensure that signal distortion(s) resulting from the bandwidth reduction can be digitally corrected through DPD, the nonlinear bandwidth compression circuitry 78 is configured to nonlinearly modify the predefined voltage amplitudes 80 to ensure that the modified voltage amplitudes 84 are greater than or equal to the predefined voltage amplitudes 80, respectively, at all times. In this regard, FIG. 7 is a schematic diagram providing an exemplary illustration of the nonlinear bandwidth compression circuitry 78 of FIG. 3 according to one embodiment of the present disclosure. Common elements between FIGS. 3 and 7 are shown therein with common element numbers and will not be re-described herein.

The nonlinear bandwidth compression circuitry 78 includes an input node 160, an output node 162, and a reference node 164. The nonlinear bandwidth compression circuitry 78 also includes a delay path 166 provided between the input node 160 and the reference node 164. The nonlinear bandwidth compression circuitry 78 also includes control circuitry 168, which can be a microprocessor, a microcontroller, or a field-programmable gate array (FPGA), for example. The control circuitry 168 can include a reference input interface 170 coupled to the reference node 164, an output interface 172 coupled to the output node 162, on or more input interfaces 174(1)-174(N), and a feedback interface 176. The nonlinear bandwidth compression circuitry 78 also includes one or more combiners 178(1)-178(N) coupled between the delay path 166 and the input interfaces 174(1)-174(N), respectively. The nonlinear bandwidth compression circuitry 78 further includes feedback circuitry 180 provided between the output interface 172 and the feedback interface 176.

The input node 160 is configured to receive the predefine voltage amplitudes 80 from the voltage LUT circuitry 76 of FIG. 3. The delay path 166 is configured to delay the predefined voltage amplitudes 80 by the defined delay T to generate a number of reference voltage amplitudes 182. The control circuitry 168 is configured to receive the reference voltage amplitudes 182 via the reference input interface 170 and generate the modified voltage amplitudes 84 that are greater than or equal to the reference voltage amplitudes 182, respectively, at all times. The control circuitry 168 provides the modified voltage amplitudes 84 to the output interface 172 and, thus, the output node 162.

Notably, the modified voltage amplitudes 84 are delayed from the predefined voltage amplitudes 80 by the defined delay T. This is necessary to ensure that a time-variant modified amplitude envelope defined by the modified voltage amplitudes 84 is consistently greater than or equal to the time-variant predefined amplitude envelope defined by the predefined voltage amplitudes 80.

Figure 8:
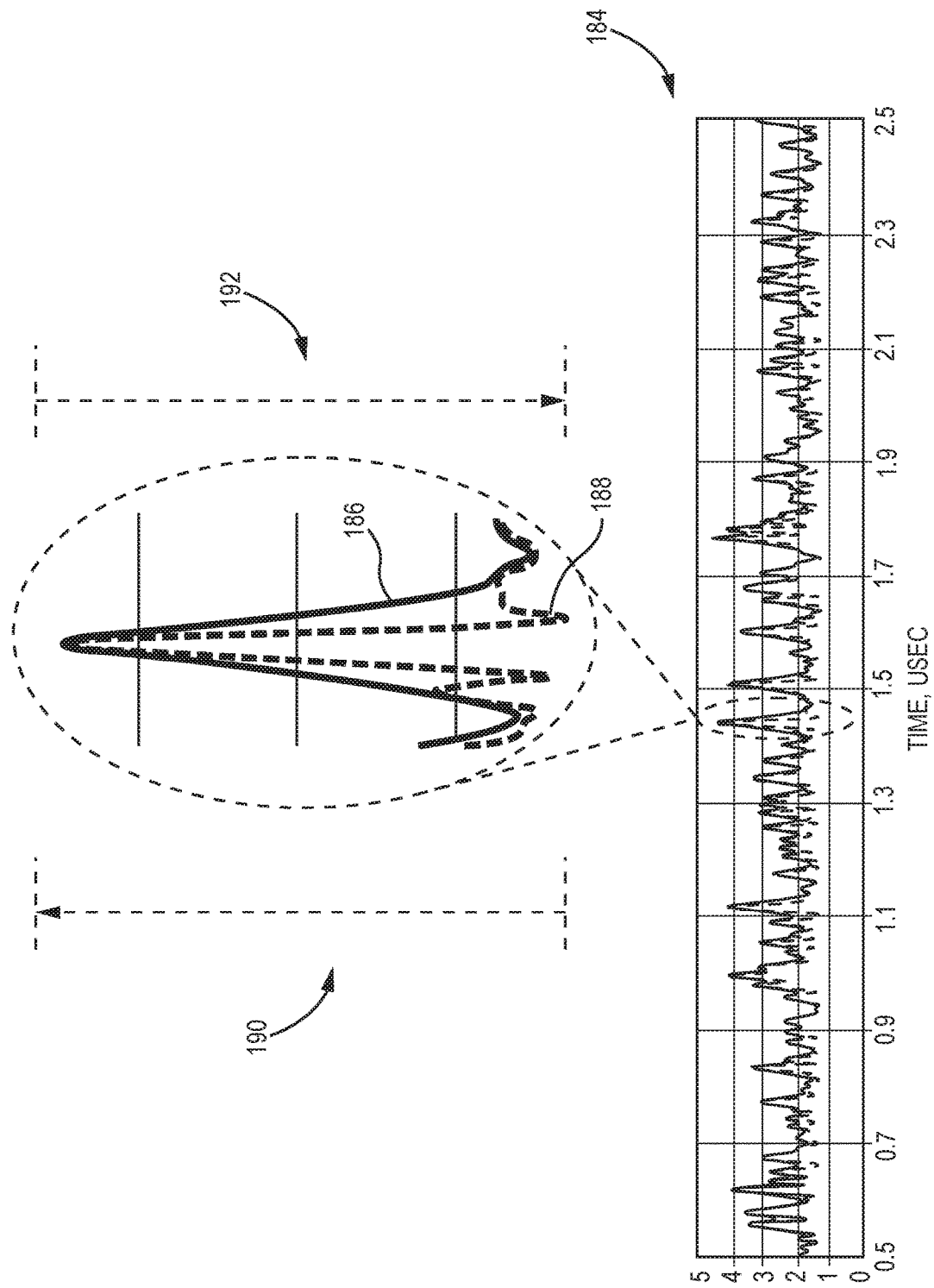
FIG. 8 is a graphic diagram providing an exemplary illustration of a time-variant modified amplitude envelope and a time-variant predefined amplitude envelope.

In this regard, FIG. 8 is a graphic diagram 184 providing an exemplary illustration of a time-variant modified amplitude envelope 186 defined by the modified voltage amplitudes 84 of FIG. 7 that is always greater than or equal to a time-variant predefined amplitude envelope 188 defined by the predefined voltage amplitudes 80 of FIG. 7. As shown in FIG. 8, to ensure that the modified voltage amplitudes 84 are consistently greater than or equal to the predefined voltage amplitudes 80, the time-variant modified amplitude envelope 186 needs to be greater than or equal to the time-variant predefined amplitude envelope 188 both at a rising edge 190 and a falling edge 192 of the time-variant predefined amplitude envelope 188. In particular, the nonlinear bandwidth compression circuitry 78 needs to examine a defined number of predefined voltage amplitudes (e.g., via buffering) in the future to help ensure that the time-variant modified amplitude envelope 186 is always greater than the time-variant predefined amplitude envelope 188 at the rising edge 190. In this regard, the defined delay T reflects the look-ahead operation performed by the nonlinear bandwidth compression circuitry 78.

Notably, the time-variant modified amplitude envelope 186 rises ahead of the time-variant predefined amplitude envelope 188 at the rising edge 190 and falls behind the time-variant predefined amplitude envelope 188 at the falling edge 192. This is an indication that the modified voltage amplitudes 84 generated by the nonlinear bandwidth compression circuitry 78 correspond to a reduced slew rate compared to the predefined voltage amplitudes 80. Accordingly, the modified voltage amplitudes 84 correspond to a reduced voltage modulation bandwidth relative to the predefined voltage amplitudes 80.

With reference back to FIG. 7, the delay path 166 can include one or more delay circuits 194(1)-194(N). The delay circuits 194(1)-194(N) may be provided in series between the input node 160 and the reference node 164. The delay circuits 194(1)-194(N) are configured to generate one or more delta delays τi ($1 \leq i \leq N$). In this regard, the defined delay T of the delay path 166 can be determined based on equation (Eq. 1) below.

$$T = D_P + \Sigma_1^N \tau i \qquad \text{(Eq. 1)}$$

In the equation (Eq. 1) above, $D_P$ represents propagation delay between the delay circuits 194(1)-194(N), which may be negligible. Accordingly, the defined delay T can be said to be approximately equal to a sum of the delta delays τi (1≤i≤N) of the delay circuits 194(1)-194(N), as shown in equation (Eq. 2) below.

$$T \approx \Sigma_1^N \tau i \qquad (Eq.\ 2)$$

In one non-limiting example, the delay path 166 can include at least two delay circuits having the delta delays t being equal to a clock duration of a sampling frequency at which the signal amplitudes 66 are sampled. In another non-limiting example, the delay path 166 can include at least two delay circuits having the delta delays t being different.

An exact number of the delay circuits 194(1)-194(N) may depend on a number of factors. In a non-limiting example, the number of the delay circuits N can be determined based on equation (Eq. 3) below.

$$N \geq \frac{\text{Sample Rate}}{(\text{Modulation Bandwidth}) * 2R} \qquad (Eq.\ 3)$$

In the equation (Eq. 3) above, R represents a ratio between New Slew Rate and Original Slew Rate. For example, if the Sample Rate equals 491.52 MHz, the Original Slew Rate equals 400V/second, the New Slew Rate equals 100V/second, and the Modulation Bandwidth equals 100 MHz, then the number of delay circuits N should be greater than or equal to 9.83. As such, the delay path 166 would need to include 10 delay circuits. Accordingly, 10 combiners would need to be included in the nonlinear bandwidth compression circuitry 78 as well.

The delay circuits 194(1)-194(N) include a number of input ends 196(1)-196(N) and a number of output ends 198(1)-198(N), respectively. Accordingly, the combiners 178(1)-178(N) are provided in parallel between the input ends 196(1)-196(N) and the input interfaces 174(1)-174(N), respectively.

For the convenience of reference and illustration, the input interface 174(1) is also referred to as a first input interface 174(1), the input interface 174(N) is also referred to as a last input interface 174(N), and the input interfaces 174(2)-174(3) are also referred to as intermediate input interfaces 174(2)-174(3). The intermediate input interfaces 174(2)-174(3) are succeeding to the first input interface 174(1), and the last input interface 174(N) is succeeding to the intermediate input interfaces 174(2)-174(3). Accordingly, the first input interface 174(1) is an immediate preceding input interface to the input interface 174(2), the input interface 174(2) is an immediate preceding input interface to the input interface 174(3), and so on.

Similarly, the delay circuit 194(1) is also referred to as a first delay circuit 194(1), the delay circuit 194(N) is referred to as a last delay circuit 194(N), and the delay circuits 194(2)-194(3) are also referred to as intermediate delay circuits 194(2)-194(N). The intermediate delay circuits 194(2)-194(3) are succeeding to the first delay circuit 194(1), and the last delay circuit 194(N) is succeeding to the intermediate delay circuits 194(2)-194(3). Accordingly, the first delay circuit 194(1) is an immediate preceding delay circuit to the delay circuit 194(2), the delay circuit 194(2) is an immediate preceding delay circuit to the delay circuit 194(3), and so on. The input end 196(1) of the first delay circuit 194(1) is coupled to the input node 160. The input ends 196(2)-196(N) are coupled to the output ends 198(1)-198(3), respectively. The output end 198(N) is coupled to the reference node 164.

The combiner 178(1) is also referred to as a first combiner 178(1), the combiner 178(N) is referred to as a last combiner 178(N), and the combiners 178(2)-178(3) are also referred to as intermediate combiners 178(2)-178(N). The intermediate combiners 178(2)-178(3) are succeeding to the first combiner 178(1), and the last combiner 178(N) is succeeding to the intermediate combiners 178(2)-178(3). Accordingly, the first combiner 178(1) is an immediate preceding combiner to the combiner 178(2), the combiner 178(2) is an immediate preceding combiner to the combiner 178(3), and so on. The first combiner 178(1) is coupled between the input end 196(1) of the first delay circuit 194(1) and the first input interface 174(1). The intermediate combiners 178(2)-178(3) are coupled between the input ends 196(2)-196(3) of the intermediate delay circuits 194(2)-194(3) and the intermediate input interfaces 174(2)-174(3), respectively. The last combiner 178(N) is coupled between the input end 196(N) of the last delay circuit 194(N) and the last input interface 174(N).

The first delay circuit 194(1) is configured to receive the predefined voltage amplitudes 80 at the input end 196(1) and output the predefined voltage amplitudes 80 after delta delay τ1. The intermediate delay circuits 194(2)-194(3) are configured to receive the predefined voltage amplitudes 80 at the input ends 196(2)-196(3) and output the predefined voltage amplitudes 80 at the output ends 198(2)-198(3) after the delta delays τi (2≤i≤3), respectively. The last delay circuit 194(N) is configured to receive the predefined voltage amplitudes 80 at the input end 196(N) and output the reference voltage amplitudes 182 at the output end 198(N) after the delta delay τN.

The combiners 178(1)-178(N) are configured to receive the predefined voltage amplitudes 80 via the input ends 196(1)-196(N), respectively. The combiners 178(1)-178(N) combine the predefined voltage amplitudes 80 with one or more delta voltages $\Delta V_i$ ((1≤i≤N) to generate a number of adjusted predefined voltage amplitudes 200(1)-200(N), respectively. The combiners 178(1)-178(N) provide the adjusted predefined voltage amplitudes 200(1)-200(N) to the input interfaces 174(1)-174(N), respectively. In a non-limiting example, the delta voltages $\Delta V_i$ ((1≤i≤N) are determined based on the equation (Eq. 4) below.

$$\Delta V_i = -(N+1-i)*dV \qquad (Eq.\ 4)$$

In the equation (Eq. 4), dV represents a voltage unit, which can be 1 volt (1V) for example. In a non-limiting example, dV can be determined according to equation (Eq. 5) below.

$$dV = (\text{Desired Slew Rate})/(\text{Digital Signal Sample Rate}) \qquad (Eq.\ 5)$$

According to equation (Eq. 3), the first combiner 178(1) has a delta voltage $\Delta V_1 = -N*dV$, the intermediate combiner 178(2) has a delta voltage $\Delta V_2 = -(N-1)*dV$, the intermediate combiner 178(3) has a delta voltage $\Delta V_3 = -(N-2)*dV$, and the last combiner 178(N) has the delta voltage $\Delta V_N = -dV$.

The feedback circuitry 180 includes a feedback delay circuit 202 configured to receive the modified voltage amplitudes 84 and delay the modified voltage amplitudes 84 by a respective delta delay τ. The feedback circuitry 180 also includes a feedback combiner 204 configured to generate a number of feedback voltage amplitudes 206. In a non-limiting example, the feedback combiner 204 is configured to generate the feedback voltage amplitudes 206 by reducing the modified voltage amplitudes 84 by a respective delta voltage (e.g., -dV). The feedback combiner 204 then provides the feedback voltage amplitudes 206 to the feedback interface 176.

For each of the modified voltage amplitudes 84, the control circuitry 168 is configured to output maximum voltage amplitude at the output interface 172. The maximum voltage amplitude is selected from each of the adjusted predefined voltage amplitudes 200(1)-200(N) received via the input interfaces 174(1)-174(N), each of the reference voltage amplitudes 182 received via the reference input interface 170, and each of the feedback voltage amplitudes 206 received via the feedback interface 176. To help illustrate how the control circuitry 168 generates the modified voltage amplitudes 84, a non-limiting example is discussed below with reference to FIG. 9.

Figure 9:
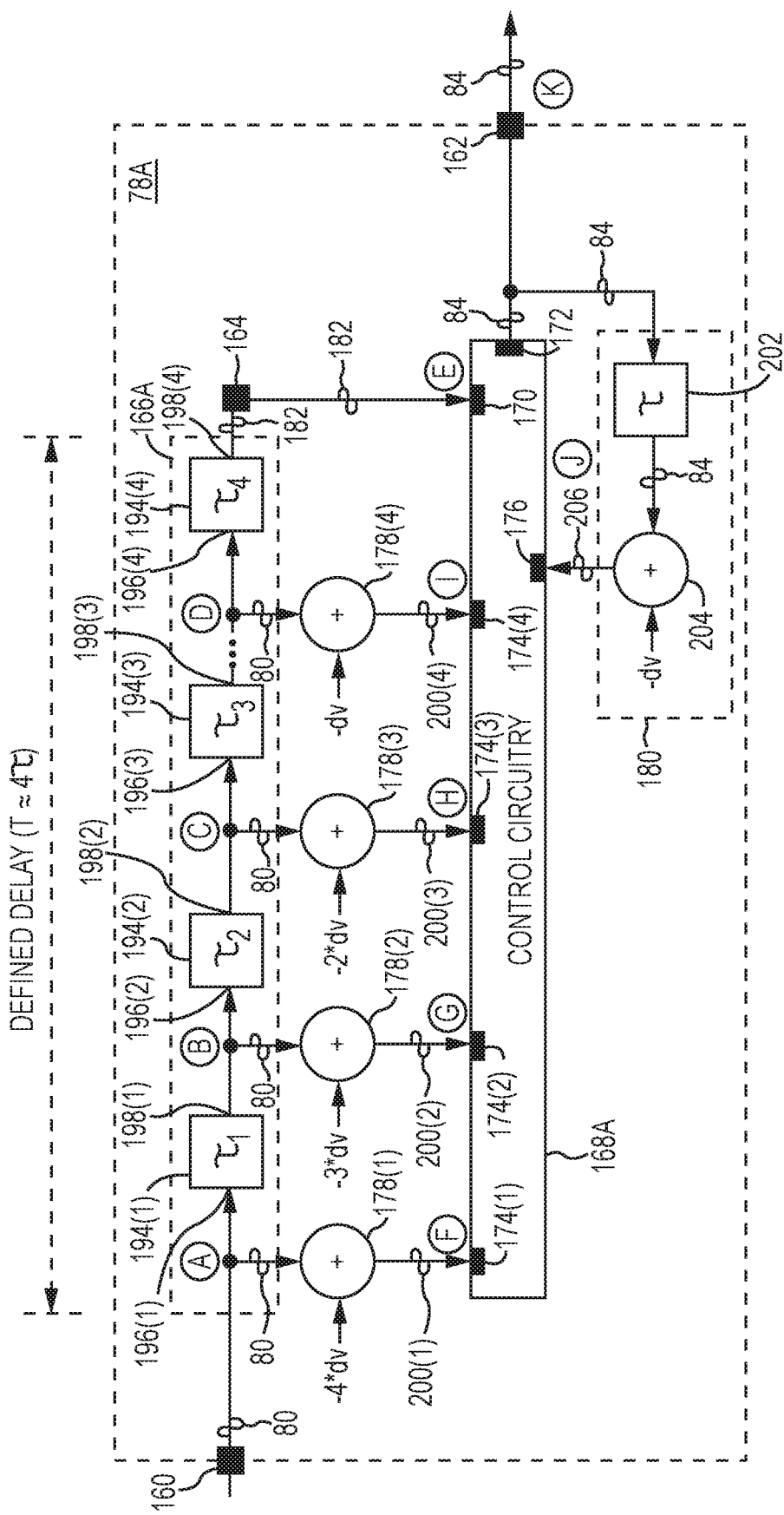
FIG. 9 is a schematic diagram of exemplary nonlinear bandwidth compression circuitry configured according to a specific embodiment of the nonlinear bandwidth compression circuitry of FIG. 7.

FIG. 9 is a schematic diagram of exemplary nonlinear bandwidth compression circuitry 78A configured according to a specific embodiment of the nonlinear bandwidth compression circuitry 78 of FIG. 7. Common elements between FIGS. 7 and 9 are shown therein with common element numbers and will not be re-described herein.

The nonlinear bandwidth compression circuitry 78A includes a delay path 166A. The delay path 166A includes four delay circuits 194(1)-194(4), wherein the delay circuit 194(1) is also referred as the first delay circuit 194(1), the delay circuits 194(2)-194(3) are also referred as the intermediate delay circuits 194(2)-194(3), and the delay circuit 194(4) is also referred to as the last delay circuit 194(4). The delay circuits 194(1)-194(4) are configured to have an identical delta delay τ. The delay circuits 194(1)-194(4) have four input ends 196(1)-196(4) and four output ends 198(1)-198(4), respectively.

The nonlinear bandwidth compression circuitry 78A includes control circuitry 168A, which has four input interlaces 174(1)-174(4). The input interface 174(1) is also referred as the first input interface 174(1), the input interfaces 174(2)-174(3) are also referred as the intermediate input interfaces 174(2)-174(3), and the input interface 174(4) is also referred to as the last input interface 174(4).

The nonlinear bandwidth compression circuitry 78A also includes four combiners 178(1)-178(4), coupled between the input ends 196(1)-196(4) and the input interfaces 174(1)-174(4), respectively. The combiner 178(1) is also referred as the first combiner 178(1), the combiners 178(2)-178(3) are also referred as the intermediate combiners 178(2)-178(3), and the combiner 178(4) is also referred to as the last combiner 178(4). The combiners 178(1)-178(4) have delta voltages $\Delta V_1$-$\Delta V_4$ equal to −4*dV, −3*dV, −2*dV, and −dV, respectively.

Table 1 below provides a non-limiting example of the nonlinear bandwidth compression circuitry 78A configured to generate the modified voltage amplitudes 84 with a positive slew rate (e.g., rising edge).

At any given time t (corresponds to each row in Table 1), a corresponding modified voltage amplitude (corresponding to column K in Table 1) is determined by selecting a maximum value among columns E-J in Table 1. Given that the nonlinear bandwidth compression circuitry 78A includes four delay circuits 194(1)-194(4), the defined delay T of the delay path 166A equals approximately 4τ. As such, the modified voltage amplitudes 84 may be undefined or pre-loaded with some values until time $T_0$+4τ.

At time $T_0$+4τ, the maximum voltage amplitude is determined by the reference voltage amplitude 182 in column E (=1). Accordingly, the modified voltage amplitude 84 in column K is determined by the reference voltage amplitude 182. In this regard, the modified voltage amplitude 84 equals the reference voltage amplitude 182 in column E.

At time $T_0$+5τ, the maximum voltage amplitude is determined by the adjusted predefined voltage amplitude 200(1) in column F (=1.5). In the meantime, the reference voltage amplitude 182 in column E remains at 1. As such, the modified voltage amplitude 84 in column K is determined by the adjusted predefined voltage amplitude 200(1) in column F, which is greater than the reference voltage amplitude 182 in column E.

At time $T_0$+6τ, the maximum voltage amplitude is determined by the adjusted predefined voltage amplitude 200(2) in column G (=2.5). In the meantime, the reference voltage amplitude 182 in column E remains at 1 and the adjusted predefined voltage amplitude 200(1) in column F remains at 1.5. As such, the modified voltage amplitude 84 in column K is determined by the adjusted predefined voltage amplitude 200(2) in column G, which is greater than the reference voltage amplitude 182 in column E.

At time $T_0$+7τ, the maximum voltage amplitude is determined by the adjusted predefined voltage amplitude 200(3) in column H (=3.5). In the meantime, the reference voltage amplitude 182 in column E remains at 1, the adjusted predefined voltage amplitude 200(1) in column F remains at 1.5, and the adjusted predefined voltage amplitude 200(2) in column G remains at 2.5. As such, the modified voltage amplitude 84 in column K is determined by the adjusted predefined voltage amplitude 200(3) in column H, which is greater than the reference voltage amplitude 182 in column E.

At time $T_0$+8τ, the maximum voltage amplitude is determined by the adjusted predefined voltage amplitude 200(4) in column I (=4.5). In the meantime, the reference voltage amplitude 182 in column E remains at 1, the adjusted predefined voltage amplitude 200(1) in column F remains at 1.5, the adjusted predefined voltage amplitude 200(2) in column G remains at 2.5, and the adjusted predefined voltage amplitude 200(3) in column H remains at 3.5. As

TABLE 1

| Time (t) | A | B | C | D | E | F | G | H | I | J | K |
|---|---|---|---|---|---|---|---|---|---|---|---|
| $T_0$ | 1 | — | — | — | — | −3 | — | — | — | — | — |
| $T_0$ + τ | 1 | 1 | — | — | — | −3 | −2 | — | — | — | — |
| $T_0$ + 2τ | 1 | 1 | 1 | — | — | −3 | −2 | −1 | — | — | — |
| $T_0$ + 3τ | 1 | 1 | 1 | 1 | — | −3 | −2 | −1 | 0 | — | — |
| $T_0$ + 4τ | 1 | 1 | 1 | 1 | 1 | −3 | −2 | −1 | 0 | — | 1 |
| $T_0$ + 5τ | 5.5 | 1 | 1 | 1 | 1 | 1.5 | −2 | −1 | 0 | 0 | 1.5 |
| $T_0$ + 6τ | 5.5 | 5.5 | 1 | 1 | 1 | 1.5 | 2.5 | −1 | 0 | 0.5 | 2.5 |
| $T_0$ + 7τ | 5.5 | 5.5 | 5.5 | 1 | 1 | 1.5 | 2.5 | 3.5 | 0 | 1.5 | 3.5 |
| $T_0$ + 8τ | 5.5 | 5.5 | 5.5 | 5.5 | 1 | 1.5 | 2.5 | 3.5 | 4.5 | 2.5 | 4.5 |
| $T_0$ + 9τ | 5.5 | 5.5 | 5.5 | 5.5 | 5.5 | 1.5 | 2.5 | 3.5 | 4.5 | 3.5 | 5.5 | such, the modified voltage amplitude 84 in column K is determined by the adjusted predefined voltage amplitude 200(4) in column I, which is greater than the reference voltage amplitude 182 in column E.

At time $T_0+9\tau$, the maximum voltage amplitude is once again determined by the reference voltage amplitude 182 in column E (=5.5). Accordingly, the modified voltage amplitude 84 in column K equals the reference voltage amplitude 182. In this regard, the modified voltage amplitude 84 equals the reference voltage amplitude 182 in column E.

A couple of observations can be made from the examples shown in Table 1. First, the nonlinear bandwidth compression circuitry 78A cannot generate the modified voltage amplitudes 84 until after the defined delay T of the delay path 166A. Second, by selecting the maximum voltage amplitude among columns E-J at any given time t, the nonlinear bandwidth compression circuitry 78A can ensure that the modified voltage amplitudes 84 are always greater than or equal to the reference voltage amplitudes 182, and thus the predefined voltage amplitudes 80.

Table 2 below provides a non-limiting example of the nonlinear bandwidth compression circuitry 78A configured to generate the modified voltage amplitudes 84 with a negative slew rate (e.g., falling edge).

TABLE 2

| Time (t) | Voltage Amplitude | | | | | | | | | | |
|---|---|---|---|---|---|---|---|---|---|---|---|
| | A | B | C | D | E | F | G | H | I | J | K |
| $T_0$ | 5.5 | — | — | — | — | 1.5 | — | — | — | — | — |
| $T_0 + \tau$ | 5.5 | 5.5 | — | — | — | 1.5 | 2.5 | — | — | — | — |
| $T_0 + 2\tau$ | 5.5 | 5.5 | 5.5 | — | — | 1.5 | 2.5 | 3.5 | — | — | — |
| $T_0 + 3\tau$ | 5.5 | 5.5 | 5.5 | 5.5 | — | 1.5 | 2.5 | 3.5 | 4.5 | — | — |
| $T_0 + 4\tau$ | 5.5 | 5.5 | 5.5 | 5.5 | 5.5 | 1.5 | 2.5 | 3.5 | 4.5 | 5.5 | 5.5 |
| $T_0 + 5\tau$ | 1 | 5.5 | 5.5 | 5.5 | 5.5 | −3 | 2.5 | 3.5 | 4.5 | 4.5 | 5.5 |
| $T_0 + 6\tau$ | 1 | 1 | 5.5 | 5.5 | 5.5 | −3 | −2 | 3.5 | 4.5 | 4.5 | 5.5 |
| $T_0 + 7\tau$ | 1 | 1 | 1 | 5.5 | 5.5 | −3 | −2 | −1 | 4.5 | 4.5 | 5.5 |
| $T_0 + 8\tau$ | 1 | 1 | 1 | 1 | 5.5 | −3 | −2 | −1 | 0 | 4.5 | 5.5 |
| $T_0 + 9\tau$ | 1 | 1 | 1 | 1 | 1 | −3 | −2 | −1 | 0 | 4.5 | 4.5 |

Figure 10:
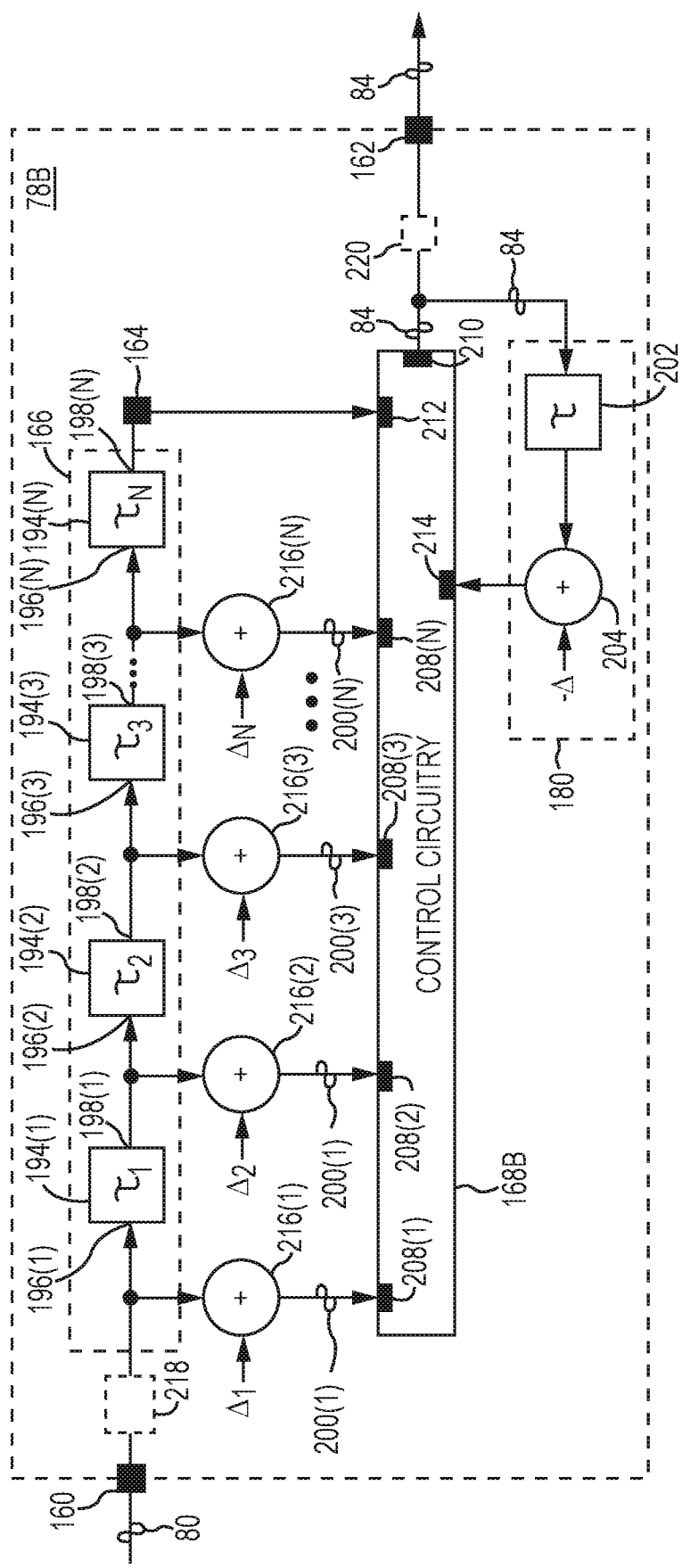
FIG. 10 is a schematic diagram of exemplary nonlinear bandwidth compression circuitry configured according to another embodiment of the present disclosure.

FIG. 10 is a schematic diagram of exemplary nonlinear bandwidth compression circuitry 78B configured according to another embodiment of the present disclosure. Common elements between FIGS. 7 and 10 are shown therein with common element numbers and will not be re-described herein.

The nonlinear bandwidth compression circuitry 78B includes control circuitry 168B, which may be functionally equivalent to the control circuitry 168 of FIG. 7. The control circuitry 168B includes a number of input interfaces 208(1)-208(N), an output interface 210, a reference input interface 212, and a reference interface 214. The nonlinear bandwidth compression circuitry 78B includes a number of combiners 216(1)-216(N). The combiners 216(1)-216(N) are coupled in parallel between input ends 196(1)-196(N) and the input interfaces 208(1)-208(N), respectively.

The nonlinear bandwidth compression circuitry 78B includes input math transform circuitry 218 and output math transform circuitry 220. The input math transform circuitry 218 is provided between the input node 160 and the delay path 166. The output math transform circuitry 220 is provided between the output interface 210 and the output node 162.

Figure 11A:
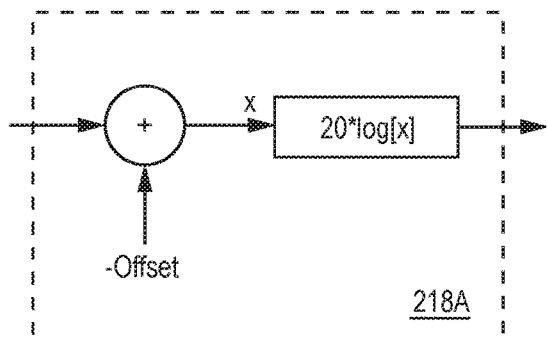
FIG. 11A is a schematic diagram of an exemplary voltage-to-logarithm transform circuitry, which can be provided in the nonlinear bandwidth compression circuitry of FIG. 10.
Figure 11B:
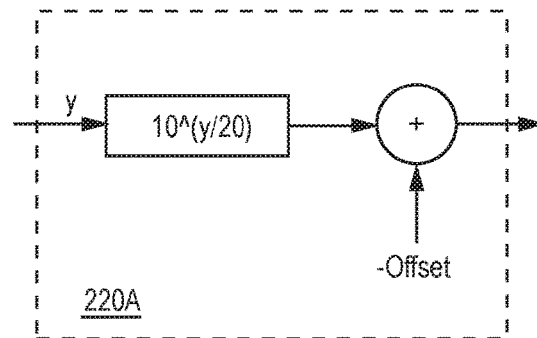
FIG. 11B is a schematic diagram of an exemplary logarithm-to-voltage transform circuitry, which can be provided in the nonlinear bandwidth compression circuitry of FIG. 10.

In one non-limiting example, the input math transform circuitry 218 can be a voltage-to-logarithm transform circuitry and the output math transform circuitry 220 can be a logarithm-to-voltage transform circuitry. FIG. 11A is a schematic diagram of an exemplary voltage-to-logarithm transform circuitry 218A, which can be provided in the nonlinear bandwidth compression circuitry 78B of FIG. 10 as the input math transform circuitry 218 to perform voltage-to-logarithm math transform. FIG. 11B is a schematic diagram of an exemplary logarithm-to-voltage transform circuitry 220A, which can be provided in the nonlinear bandwidth compression circuitry 78B of FIG. 10 as the output math transform circuitry 220 to perform logarithm-to-voltage math transform.

Figure 11C:
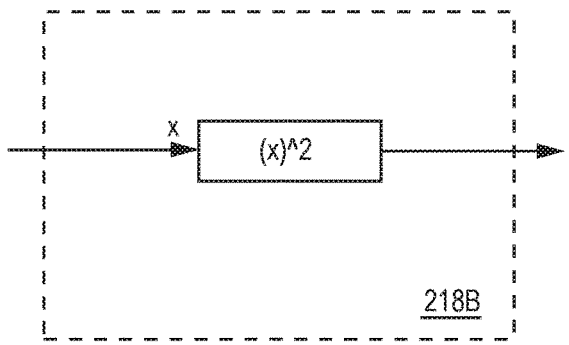
FIG. 11C is a schematic diagram of an exemplary square transform circuitry, which can be provided in the nonlinear bandwidth compression circuitry of FIG. 10.
Figure 11D:
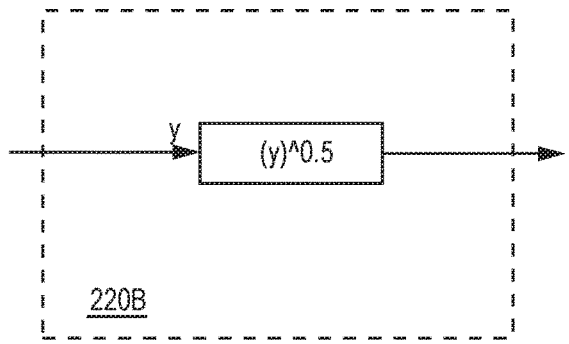
FIG. 11D is a schematic diagram of an exemplary square-root transform circuitry, which can be provided in the nonlinear bandwidth compression circuitry of FIG. 10.

In another non-limiting example, the input math transform circuitry 218 can be a square transform circuitry and the output math transform circuitry 220 can be a square-root transform circuitry. FIG. 11C is a schematic diagram of an exemplary square transform circuitry 218B, which can be provided in the nonlinear bandwidth compression circuitry 78B of FIG. 10 as the input math transform circuitry 218 to perform square math transform. FIG. 11D is a schematic diagram of an exemplary square-root transform circuitry 220B, which can be provided in the nonlinear bandwidth compression circuitry 78B of FIG. 10 as the output math transform circuitry 220 to perform square-root math transform.

Figure 12:
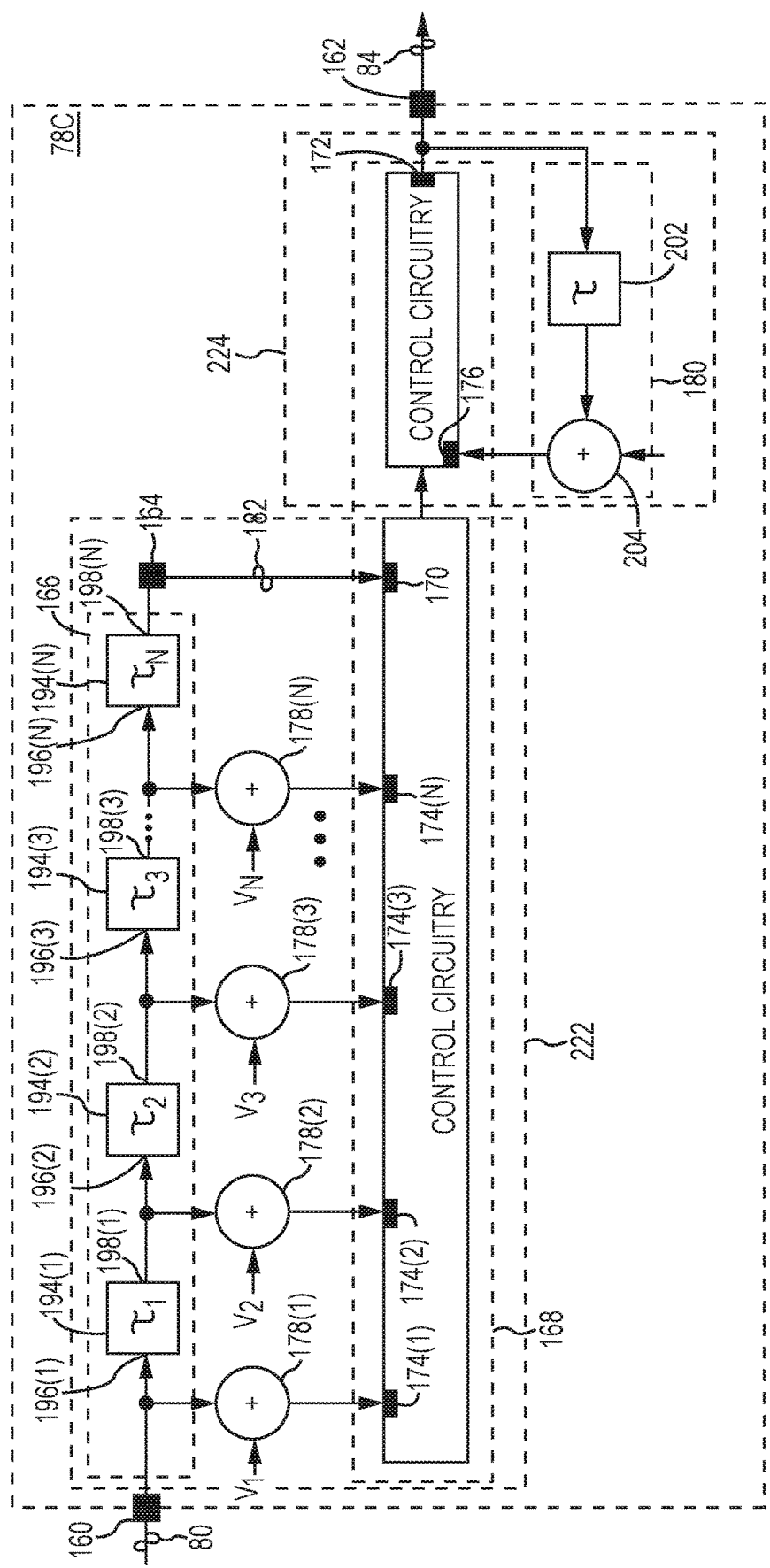
FIG. 12 is a schematic diagram of exemplary nonlinear bandwidth compression circuitry according to another embodiment of the present disclosure.

FIG. 12 is a schematic diagram of exemplary nonlinear bandwidth compression circuitry 78C configured according to another embodiment of the present disclosure. Common elements between FIGS. 7 and 12 are shown therein with common element numbers and will not be re-described herein.

The nonlinear bandwidth compression circuitry 78C includes positive slew rate circuitry 222 and negative slew rate circuitry 224. The positive slew rate circuitry 222 includes the delay path 166, the combiners 178(1)-178(N), the input interfaces 174(1)-174(N), and the reference input interface 170. The negative slew rate circuitry 224 includes the feedback circuitry 180, the feedback interface 176, and the output interface 172. The control circuitry 168 is shared by the positive slew rate circuitry 222 and the negative slew rate circuitry 224.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) system, comprising:
   a signal input configured to receive a digital signal corresponding to a signal modulation bandwidth;

a voltage output configured to output a digital voltage signal corresponding to a voltage modulation bandwidth less than the signal modulation bandwidth; and digital voltage processing circuitry configured to:
receive a plurality of signal amplitudes representing a time-variant amplitude envelope of the digital signal;
generate a plurality of predefined voltage amplitudes based on the plurality of signal amplitudes, respectively;
nonlinearly modify the plurality of predefined voltage amplitudes to generate the digital voltage signal comprising a plurality of modified voltage amplitudes consistently greater than or equal to the plurality of predefined voltage amplitudes, respectively;
perform memory digital pre-distortion (mDPD) on the digital voltage signal; and
provide the digital voltage signal to the voltage output.

2. The ET system of claim 1 wherein the digital voltage processing circuitry is further configured to generate a plurality of voltage differential amplitudes indicating amplitude differentials between the plurality of modified voltage amplitudes and the plurality of predefined voltage amplitudes, respectively.

3. The ET system of claim 2 wherein the digital voltage processing circuitry comprises:
voltage look-up table (LUT) circuitry coupled to the signal input and configured to:
receive the plurality of signal amplitudes from the signal input; and
generate the plurality of predefined voltage amplitudes based on the plurality of signal amplitudes, respectively;
a nonlinear bandwidth compression circuit coupled to the voltage LUT circuitry and configured to:
receive the plurality of predefined voltage amplitudes from the voltage LUT circuitry; and
nonlinearly modify the plurality of predefined voltage amplitudes to generate the digital voltage signal comprising the plurality of modified voltage amplitudes greater than or equal to the plurality of predefined voltage amplitudes, respectively;
voltage signal delay circuitry coupled to the voltage LUT circuitry and configured to delay the plurality of predefined voltage amplitudes by a defined delay to generate a plurality of delayed predefined voltage amplitudes, respectively; and
voltage combiner circuitry coupled to the nonlinear bandwidth compression circuit and the voltage signal delay circuitry, the voltage combiner circuitry configured to combine the plurality of modified voltage amplitudes and the plurality of delayed predefined voltage amplitudes to generate the plurality of voltage differential amplitudes, respectively.

4. The ET system of claim 3 wherein the nonlinear bandwidth compression circuit comprises:
an input node, an output node, and a reference node;
a delay path provided between the input node and the reference node;
control circuitry comprising:
a reference input interface coupled to the reference node;
an output interface coupled to the output node;
one or more input interfaces; and
a feedback interface;
one or more combiners provided in parallel between the delay path and the one or more input interfaces in the control circuitry, respectively; and
feedback circuitry provided between the output interface and the feedback interface.

5. The ET system of claim 4 wherein:
the delay path comprises one or more delay circuits provided in series between the input node and the reference node and configured to generate one or more delta delays, respectively; and
the defined delay of the delay path equals approximately a sum of the one or more delta delays.

6. The ET system of claim 5 wherein:
the one or more delay circuits comprise one or more input ends and one or more output ends, respectively; and
the one or more combiners are provided in parallel between the one or more input ends and the one or more input interfaces, respectively.

7. The ET system of claim 3 further comprising mDPD circuitry coupled to the nonlinear bandwidth compression circuit and configured to perform the mDPD on the digital voltage signal.

8. The ET system of claim 3 wherein the defined delay equals an inherent processing delay of the nonlinear bandwidth compression circuit.

9. The ET system of claim 3 further comprising:
digital signal processing circuitry configured to:
receive the plurality of signal amplitudes from the signal input;
receive the plurality of voltage differential amplitudes from the digital voltage processing circuitry; and
perform digital pre-distortion (DPD) on the digital signal based on the plurality of signal amplitudes and the plurality of voltage differential amplitudes to generate a pre-distorted digital signal comprising a plurality of pre-distorted signal amplitudes, respectively; and
a signal output configured to receive and output the pre-distorted digital signal.

10. The ET system of claim 9 wherein the digital signal processing circuitry comprises:
amplitude delay circuitry configured to delay the plurality of signal amplitudes in the digital signal by the defined delay to generate a plurality of delayed signal amplitudes; and
DPD circuitry configured to digitally pre-distort the digital signal based on the plurality of voltage differential amplitudes and the plurality of delayed signal amplitudes.

11. The ET system of claim 9 wherein the digital signal processing circuitry further comprises:
digital splitter circuitry configured to receive and split the digital signal into a digital in-phase signal comprising a plurality of in-phase signal amplitudes and a digital quadrature signal each comprising a plurality of quadrature signal amplitudes; and
in-phase/quadrature (I/Q) DPD circuitry configured to digitally pre-distort the digital in-phase signal and the digital quadrature signal to generate a pre-distorted digital in-phase signal and a pre-distorted digital quadrature signal, respectively.

12. The ET system of claim 9 further comprising:
a voltage digital-to-analog converter (DAC) coupled to the voltage output and configured to convert the digital voltage signal into a target voltage signal having a time-variant voltage envelope corresponding to the plurality of modified voltage amplitudes; and
a signal DAC coupled to the signal output and configured to convert the pre-distorted digital signal into a radio frequency (RF) signal.

13. The ET system of claim 12 further comprising:
tracker circuitry coupled to the voltage DAC and configured to receive the target voltage signal and generate an ET modulated voltage tracking the time-variant voltage envelope of the target voltage signal; and
at least one amplifier circuit configured to:
receive the RF signal from the signal DAC;
receive the ET modulated voltage from the tracker circuitry; and
amplify the RF signal based on the ET modulated voltage.

14. A transceiver circuit comprising:
a signal input configured to receive a digital signal corresponding to a signal modulation bandwidth;
a voltage output configured to output a digital voltage signal corresponding to a voltage modulation bandwidth less than the signal modulation bandwidth;
digital voltage processing circuitry configured to:
receive a plurality of signal amplitudes representing a time-variant amplitude envelope of the digital signal from the signal input;
generate a plurality of predefined voltage amplitudes based on the plurality of signal amplitudes, respectively;
nonlinearly modify the plurality of predefined voltage amplitudes to generate the digital voltage signal comprising a plurality of modified voltage amplitudes greater than or equal to the plurality of predefined voltage amplitudes, respectively;
provide the digital voltage signal to the voltage output; and
generate a plurality of voltage differential amplitudes indicating amplitude differentials between the plurality of modified voltage amplitudes and the plurality of predefined voltage amplitudes, respectively; and
digital signal processing circuitry configured to:
receive the plurality of signal amplitudes from the signal input;
receive the plurality of voltage differential amplitudes from the digital voltage processing circuitry;
perform digital pre-distortion (DPD) on the plurality of signal amplitudes and the plurality of voltage differential amplitudes to generated a pre-distorted digital signal comprising a plurality of pre-distorted signal amplitudes, respectively; and
a signal output configured to receive and output the pre-distorted digital signal.

15. The transceiver circuit of claim 14 wherein the digital voltage processing circuitry comprises:
voltage look-up table (LUT) circuitry coupled to the signal input and configured to:
receive the plurality of signal amplitudes from the signal input; and
generate the plurality of predefined voltage amplitudes based on the plurality of signal amplitudes, respectively;
a nonlinear bandwidth compression circuit coupled to the voltage LUT circuitry and configured to:
receive the plurality of predefined voltage amplitudes from the voltage LUT circuitry; and
nonlinearly modify the plurality of predefined voltage amplitudes to generate the digital voltage signal comprising the plurality of modified voltage amplitudes greater than or equal to the plurality of predefined voltage amplitudes, respectively;
voltage signal delay circuitry coupled to the voltage LUT circuitry and configured to delay the plurality of predefined voltage amplitudes by a defined delay to generate a plurality of delayed predefined voltage amplitudes, respectively; and
voltage combiner circuitry coupled to the nonlinear bandwidth compression circuit and the voltage signal delay circuitry, the voltage combiner circuitry configured to combine the plurality of modified voltage amplitudes and the plurality of delayed predefined voltage amplitudes to generate the plurality of voltage differential amplitudes, respectively.

16. The transceiver circuit of claim 15 wherein the nonlinear bandwidth compression circuit comprises:
an input node, an output node, and a reference node;
a delay path provided between the input node and the reference node;
control circuitry comprising:
a reference input interface coupled to the reference node;
an output interface coupled to the output node;
one or more input interfaces; and
a feedback interface;
one or more combiners provided in parallel between the delay path and the one or more input interfaces in the control circuitry, respectively; and
feedback circuitry provided between the output interface and the feedback interface.

17. The transceiver circuit of claim 16 wherein:
the delay path comprises one or more delay circuits provided in series between the input node and the reference node and configured to generate one or more delta delays, respectively; and
the defined delay of the delay path equals approximately a sum of the one or more delta delays.

18. The transceiver circuit of claim 17 wherein:
the one or more delay circuits comprise one or more input ends and one or more output ends, respectively; and
the one or more combiners are provided in parallel between the one or more input ends and the one or more input interfaces, respectively.

19. The transceiver circuit of claim 15 wherein the digital signal processing circuitry comprises:
amplitude delay circuitry configured to delay the plurality of signal amplitudes in the digital signal by the defined delay to generate a plurality of delayed signal amplitudes; and
DPD circuitry configured to digitally pre-distort the digital signal based on the plurality of voltage differential amplitudes and the plurality of delayed signal amplitudes.

20. The transceiver circuit of claim 19 wherein the digital signal processing circuitry further comprises:
digital splitter circuitry configured to receive and split the digital signal into a digital in-phase signal comprising a plurality of in-phase signal amplitudes and a digital quadrature signal each comprising a plurality of quadrature signal amplitudes; and
in-phase/quadrature (I/Q) DPD circuitry configured to digitally pre-distort the digital in-phase signal and the digital quadrature signal to generate a pre-distorted digital in-phase signal and a pre-distorted digital quadrature signal, respectively.

* * * * *

UNITED STATES PATENT AND TRADEMARK OFFICE
CERTIFICATE OF CORRECTION

PATENT NO. : 10,680,559 B2
APPLICATION NO. : 15/888300
DATED : June 9, 2020
INVENTOR(S) : Nadim Khlat and Andrew F. Folkmann Page 1 of 1

It is certified that error appears in the above-identified patent and that said Letters Patent is hereby corrected as shown below:

In the Specification

Column 3, Line 49, replace "(I/O)" with --(I/Q)--.
Column 11, Lines 7, 10, and 28, replace "I/O" with --I/Q--.
Column 13, Lines 11 and 15, replace "the delta delays t" with --the delta delays τ--.
Column 15, Lines 31-32, replace "four input interlaces 174(1)-174(4)" with --four input interfaces 174(1)-174(4)--.

Signed and Sealed this
Twenty-eighth Day of July, 2020

Andrei Iancu
*Director of the United States Patent and Trademark Office*